US012255154B2

(12) United States Patent
Tobioka et al.

(10) Patent No.: US 12,255,154 B2
(45) Date of Patent: Mar. 18, 2025

(54) THREE-DIMENSIONAL MEMORY DEVICE WITH ORTHOGONAL MEMORY OPENING AND SUPPORT OPENING ARRAYS AND METHOD OF MAKING THEREOF

(71) Applicant: SANDISK TECHNOLOGIES LLC, Addison, TX (US)

(72) Inventors: Akihiro Tobioka, Nagoya (JP); Yusuke Tanaka, Brussels (BE)

(73) Assignee: Sandisk Technologies, Inc., Milpitas, CA (US)

( * ) Notice: Subject to any disclaimer, the term of this patent is extended or adjusted under 35 U.S.C. 154(b) by 574 days.

(21) Appl. No.: 17/510,833

(22) Filed: Oct. 26, 2021

(65) Prior Publication Data

US 2023/0126600 A1    Apr. 27, 2023

(51) Int. Cl.
*H10B 41/27* (2023.01)
*H01L 23/00* (2006.01)
*H10B 43/27* (2023.01)

(52) U.S. Cl.
CPC ........... *H01L 23/562* (2013.01); *H10B 41/27* (2023.02); *H10B 43/27* (2023.02)

(58) Field of Classification Search
CPC ................................ H10B 43/27; H10B 43/20
See application file for complete search history.

(56) References Cited

U.S. PATENT DOCUMENTS

| 10,290,643 | B1 | 5/2019 | Kai et al. |
| 10,854,629 | B2 | 12/2020 | Ge et al. |
| 10,937,801 | B2 | 3/2021 | Otsu et al. |
| 2019/0035804 | A1 | 1/2019 | Kim et al. |
| 2020/0303398 | A1* | 9/2020 | Otsu ...................... H10B 43/27 |
| 2021/0005625 | A1 | 1/2021 | Dai et al. |
| 2021/0242241 | A1* | 8/2021 | Rajashekhar ..... H01L 29/40117 |

(Continued)

FOREIGN PATENT DOCUMENTS

| KR | 10-2018-0126210 A | 11/2018 |
| KR | 10-2018-0138381 A | 12/2018 |
| KR | 10-2019-0010230 A | 1/2019 |

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).

(Continued)

*Primary Examiner* — Christopher A Johnson
(74) *Attorney, Agent, or Firm* — THE MARBURY LAW GROUP PLLC

(57) ABSTRACT

An alternating stack of insulating layers and spacer material layers is formed over a substrate. The spacer material layers are formed as, or are subsequently replaced with, electrically conductive layers. Memory openings and support openings are formed through the alternating stack. The memory openings are arranged in a first hexagonal array having a nearest-neighbor direction that is parallel to a first horizontal direction, and the support openings are arranged in a second hexagonal array having a nearest-neighbor direction that is perpendicular to the first horizontal direction. Memory opening fill structures are formed within a respective one of the memory openings, and support pillar structures within a respective one of the support openings.

20 Claims, 37 Drawing Sheets

(56) References Cited

U.S. PATENT DOCUMENTS

2021/0288064 A1* 9/2021 Nishimura ............. H10B 41/27

OTHER PUBLICATIONS

U.S. Appl. No. 17/388,547, filed Jul. 29, 2021, SanDisk Technologies LLC.
Notification of Transmittal of The International Search Report and Written Opinion of the International Searching Authority for International Patent Application No. PCT/US2022/029336, mailed Sep. 21, 2022, 8 pages.
Korean Office Communication, Notice of Preliminary Rejection for Korean Patent Application No. Application No. 10-2024-7001120 , mailed Jan. 20, 2025, 9 pages.

\* cited by examiner

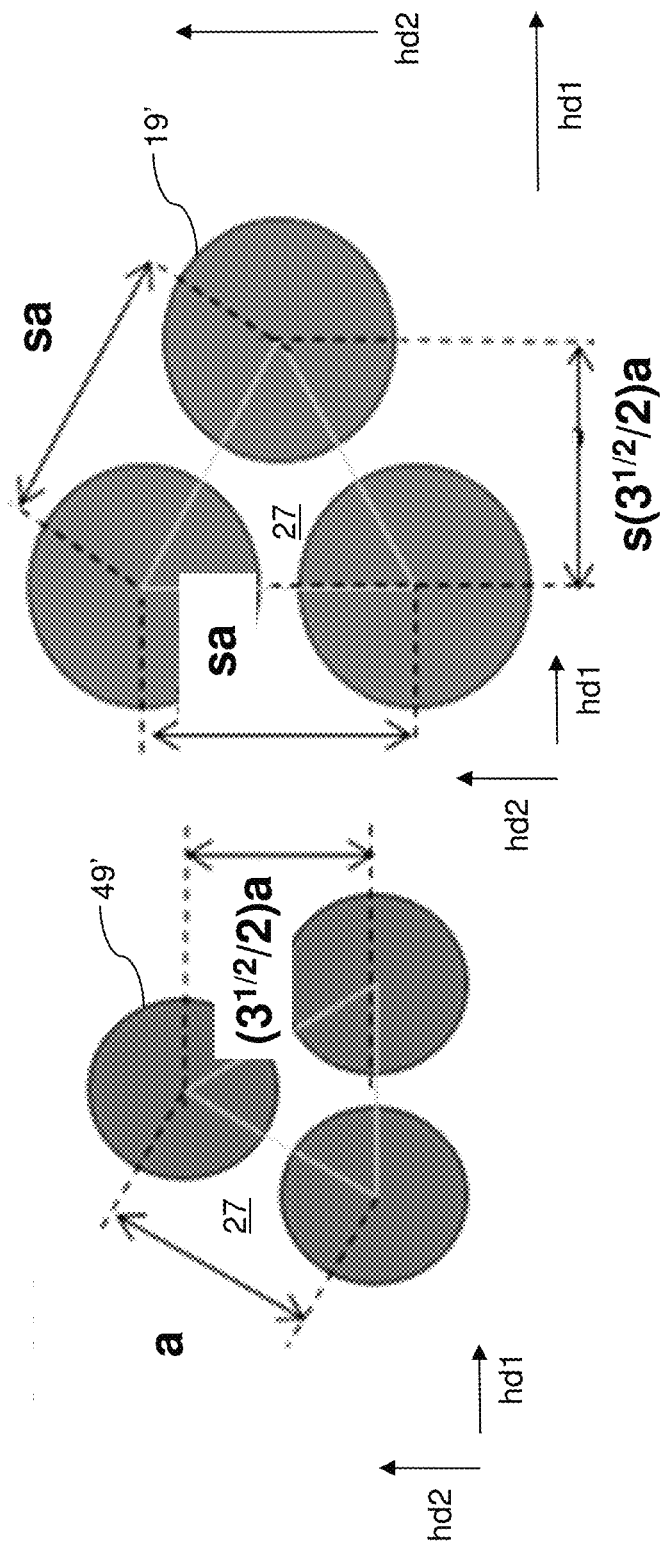

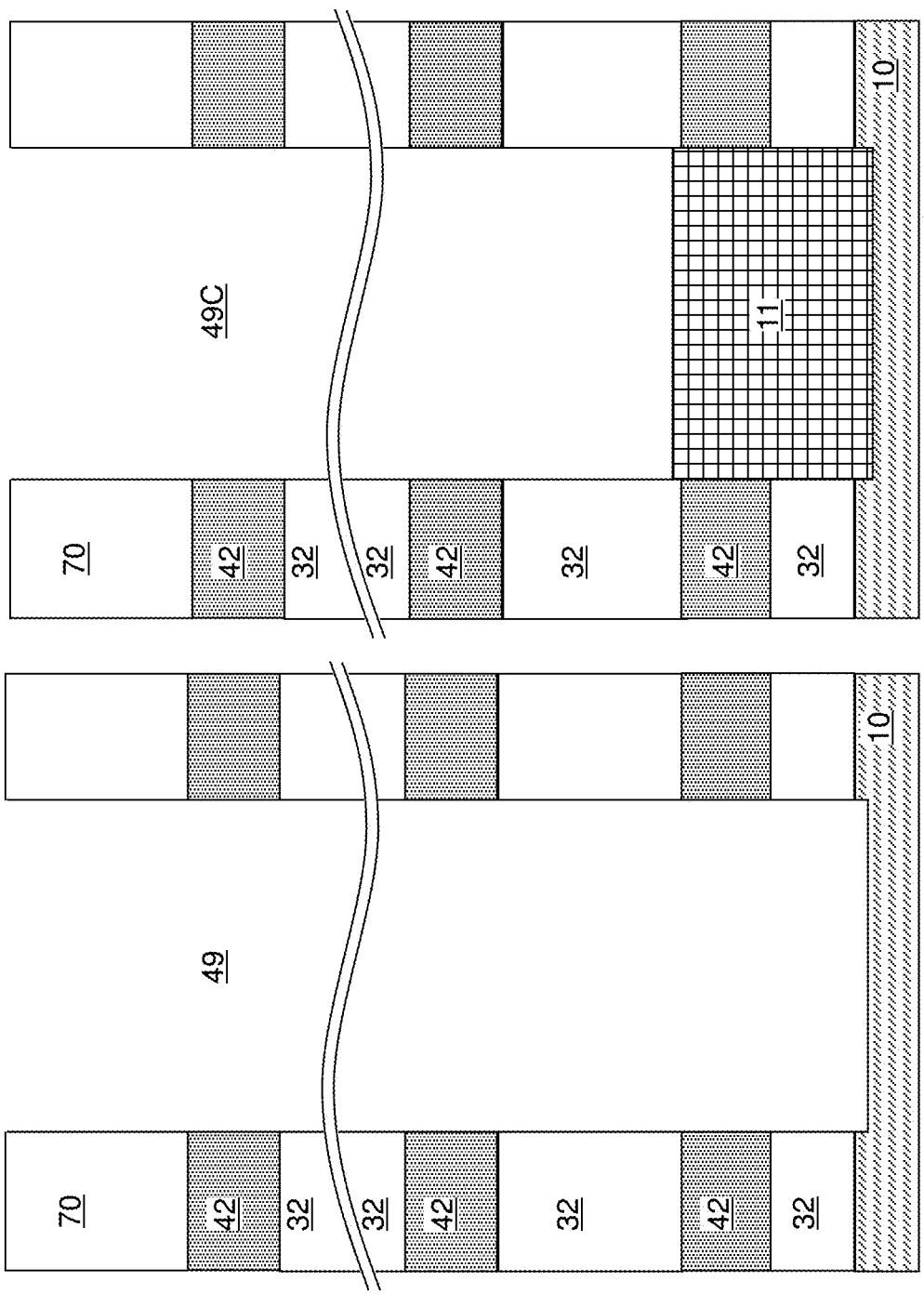

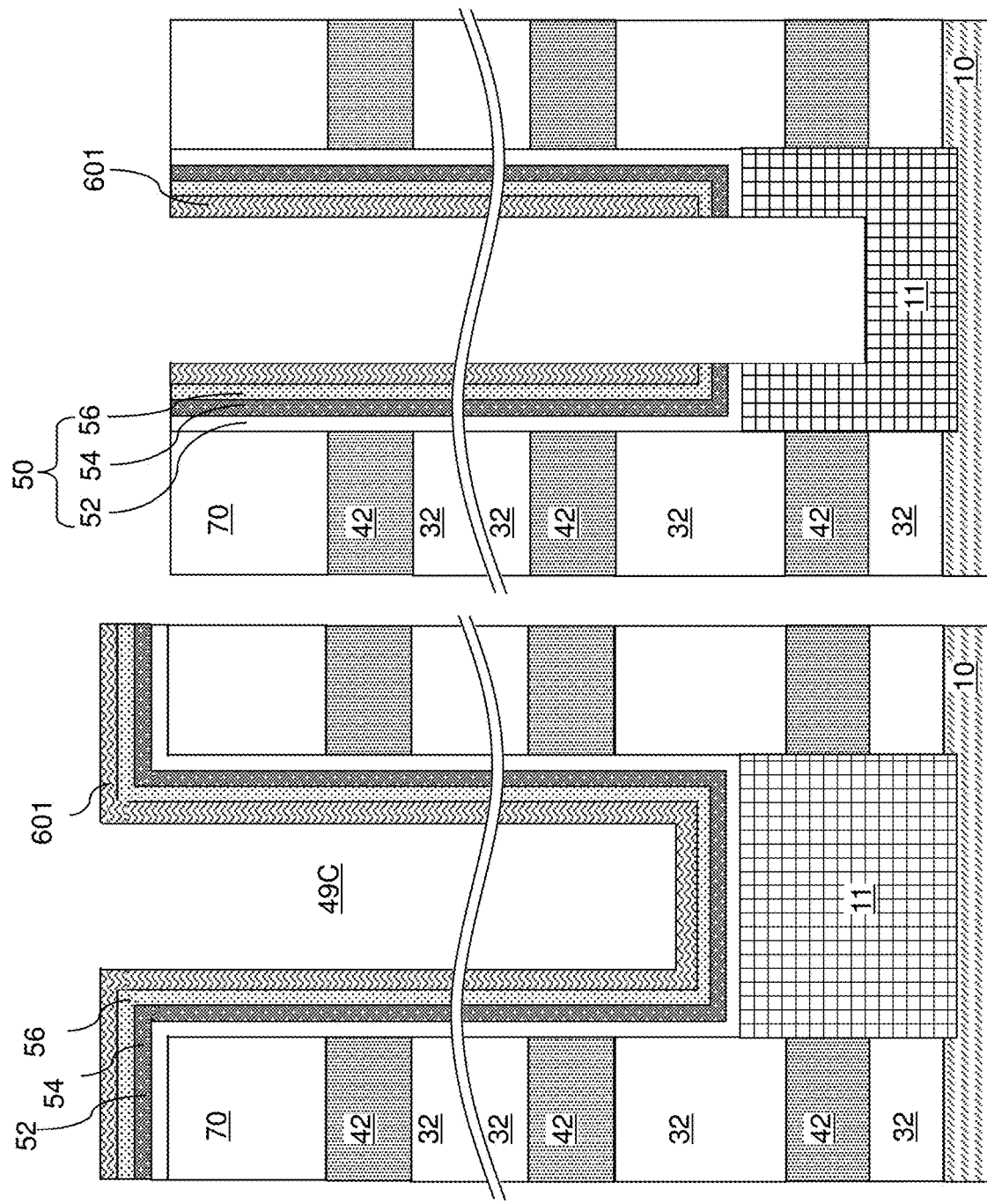

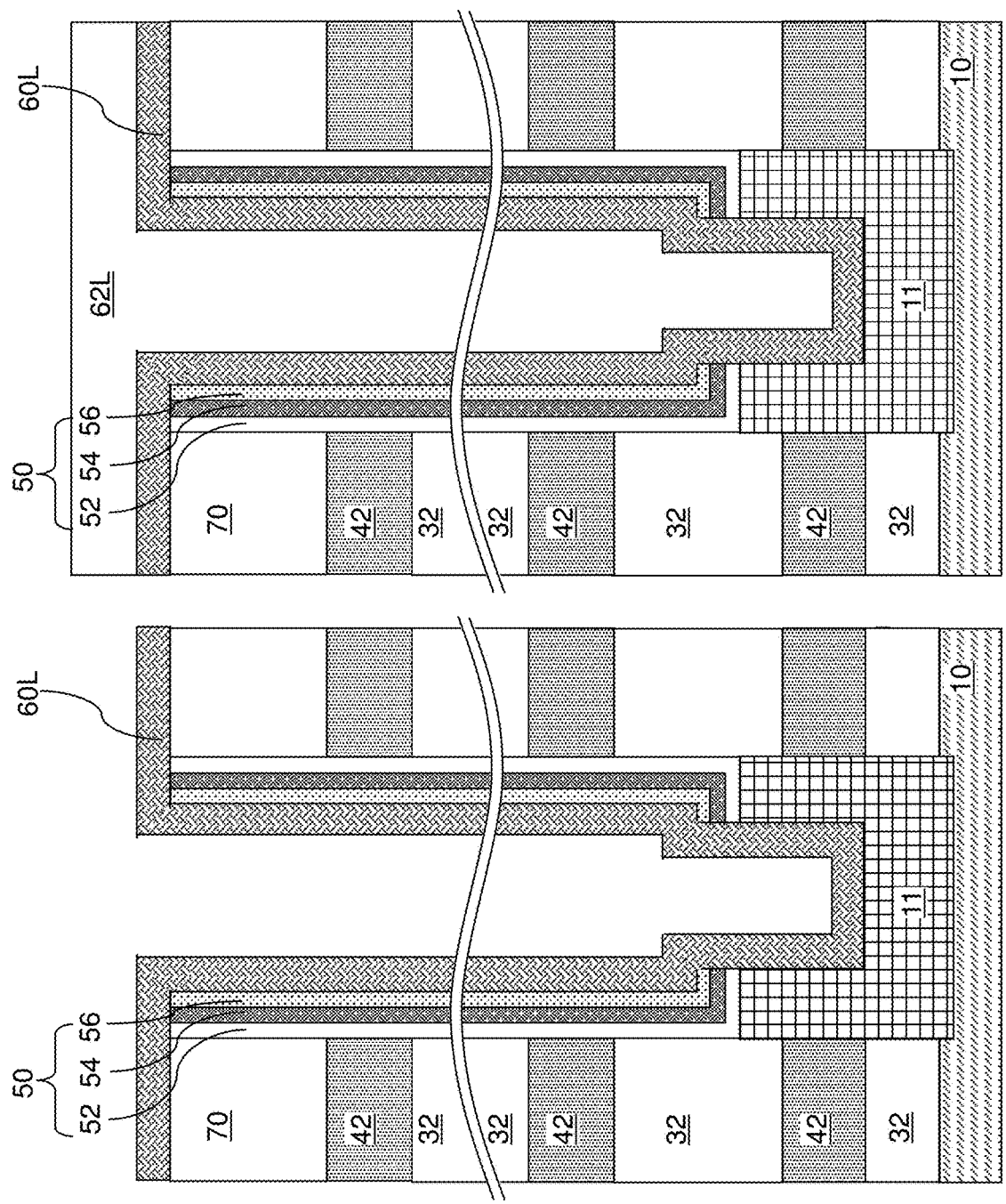

THREE-DIMENSIONAL MEMORY DEVICE WITH ORTHOGONAL MEMORY OPENING AND SUPPORT OPENING ARRAYS AND METHOD OF MAKING THEREOF

FIELD

The present disclosure relates generally to the field of semiconductor devices, and particularly to a three-dimensional memory device in which memory openings are arranged in a first hexagonal array having a nearest-neighbor direction that is parallel to a first horizontal direction, and the support openings are arranged in a second hexagonal array having a nearest-neighbor direction that is perpendicular to the first horizontal direction and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the alternating stack comprises a memory array region in which each layer within the alternating stack is present and a staircase region in which lateral extents of the electrically conductive layers decrease as a function of a vertical distance from the substrate; memory openings vertically extending through the alternating stack in the memory array region and each having a first lateral dimension; memory opening fill structures located within a respective one of the memory openings, wherein the memory opening fill structures are arranged in a first hexagonal array having a nearest-neighbor direction that is parallel to a first horizontal direction; support openings vertically extending through the alternating stack in the staircase region and each having a second lateral dimension that is different from the first lateral dimension; and support pillar structures located within a respective one of the support openings, wherein the support pillar structures are arranged in a second hexagonal array having a nearest-neighbor direction that is perpendicular to the first horizontal direction.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; patterning the alternating stack, wherein the alternating stack comprises a memory array region in which each layer within the alternating stack is present and a staircase region in which lateral extents of the spacer material layers decrease as a function of a vertical distance from the substrate; forming memory openings through the alternating stack in the memory array region, wherein the memory openings are arranged in a first hexagonal array having a nearest-neighbor direction that is parallel to a first horizontal direction; forming support openings through the alternating stack in the staircase region, wherein the support openings are arranged in a second hexagonal array having a nearest-neighbor direction that is perpendicular to the first horizontal direction; forming memory opening fill structures within a respective one of the memory openings; and forming support pillar structures within a respective one of the support openings.

BRIEF DESCRIPTION OF THE DRAWINGS

FIG. 9A is a top-down view of a portion of the embodiment periodic hexagonal array of first openings having a nearest-neighbor pitch along the first horizontal direction within the exemplary structure of FIGS. 4A and 4B.

FIG. 9B is a top-down view of a portion of the embodiment periodic hexagonal array of second openings having a nearest-neighbor pitch along the second horizontal direction in the exemplary structure of FIGS. 4A and 4B.

FIGS. 18A-18H are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
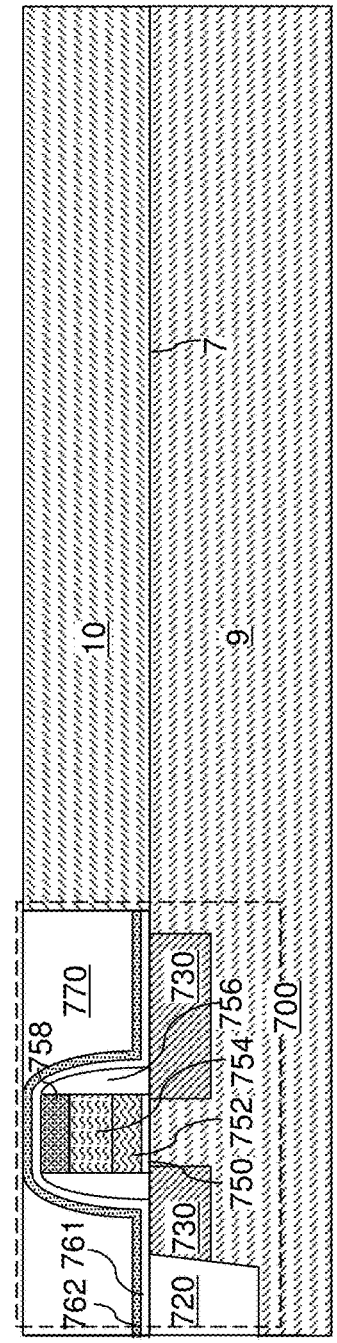
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface. As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
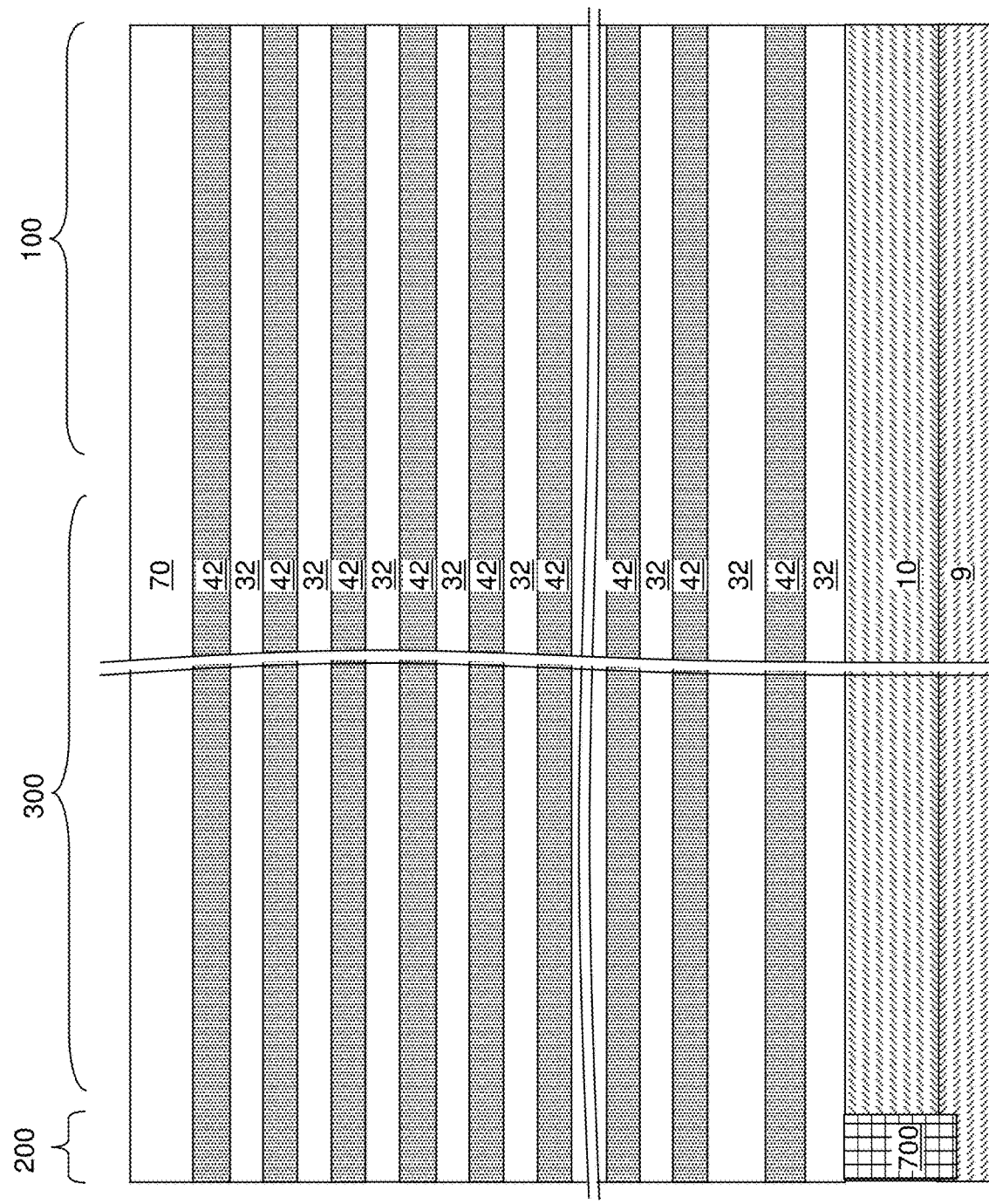
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. The sacrificial material layers 42 are replaced with electrically conductive layers that function as gate electrodes. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
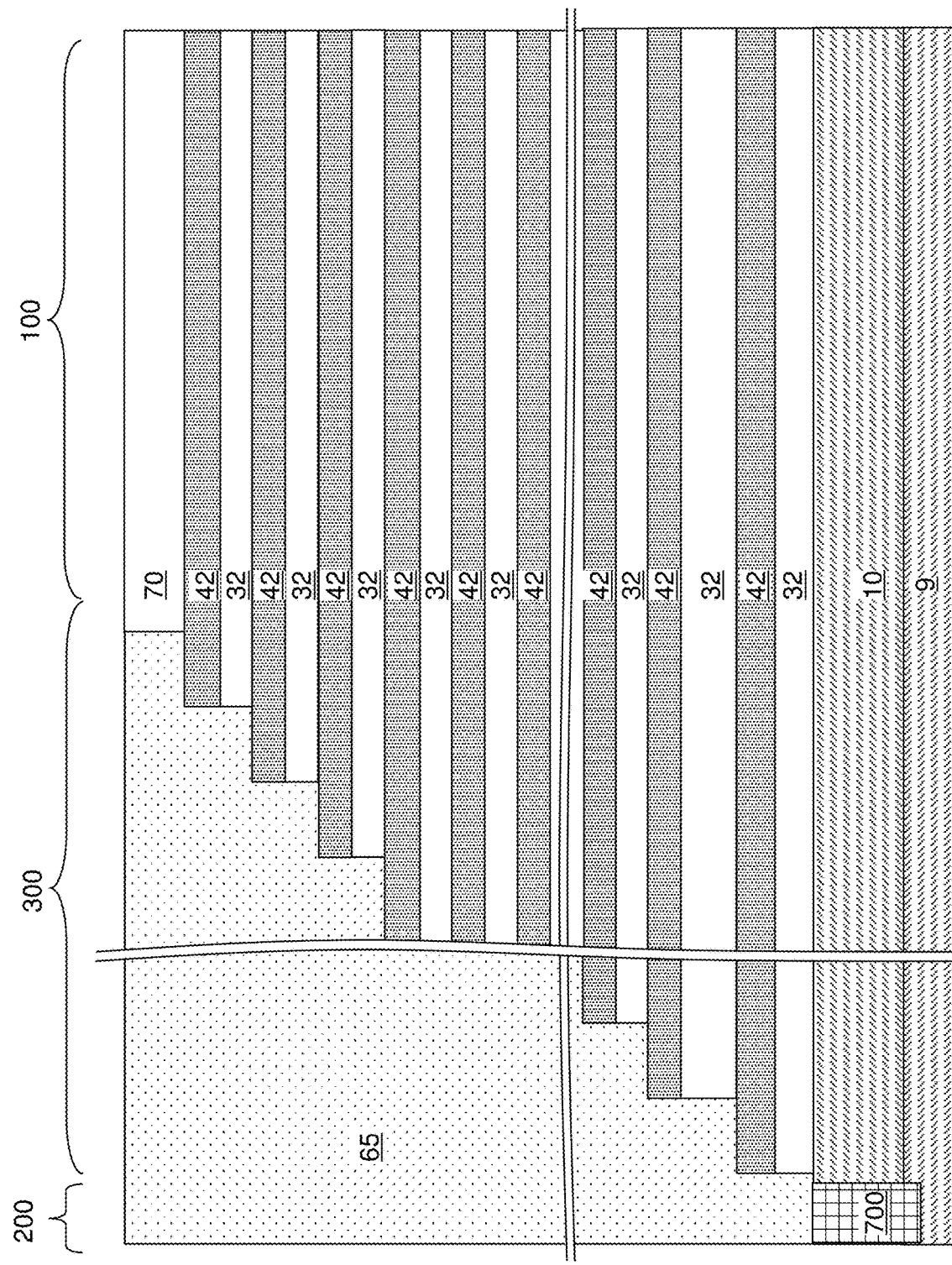
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

Generally, an alternating stack of insulating layers 32 and spacer material layers can be formed over a substrate (9, 10). The spacer material layers are formed as, or are subsequently replaced with, electrically conductive layers. In case the spacer material layers are subsequently replaced with the electrically conductive layers, the spacer material layers may comprise sacrificial material layers 42. The alternating stack (32, 42) can be patterned such that the alternating stack (32, 42) comprises a memory array region 100 in which each layer within the alternating stack (32, 42) is present and a staircase region 300 in which lateral extents of the spacer material layers (such as sacrificial material layers 42) decrease as a function of a vertical distance from the substrate (9, 10).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
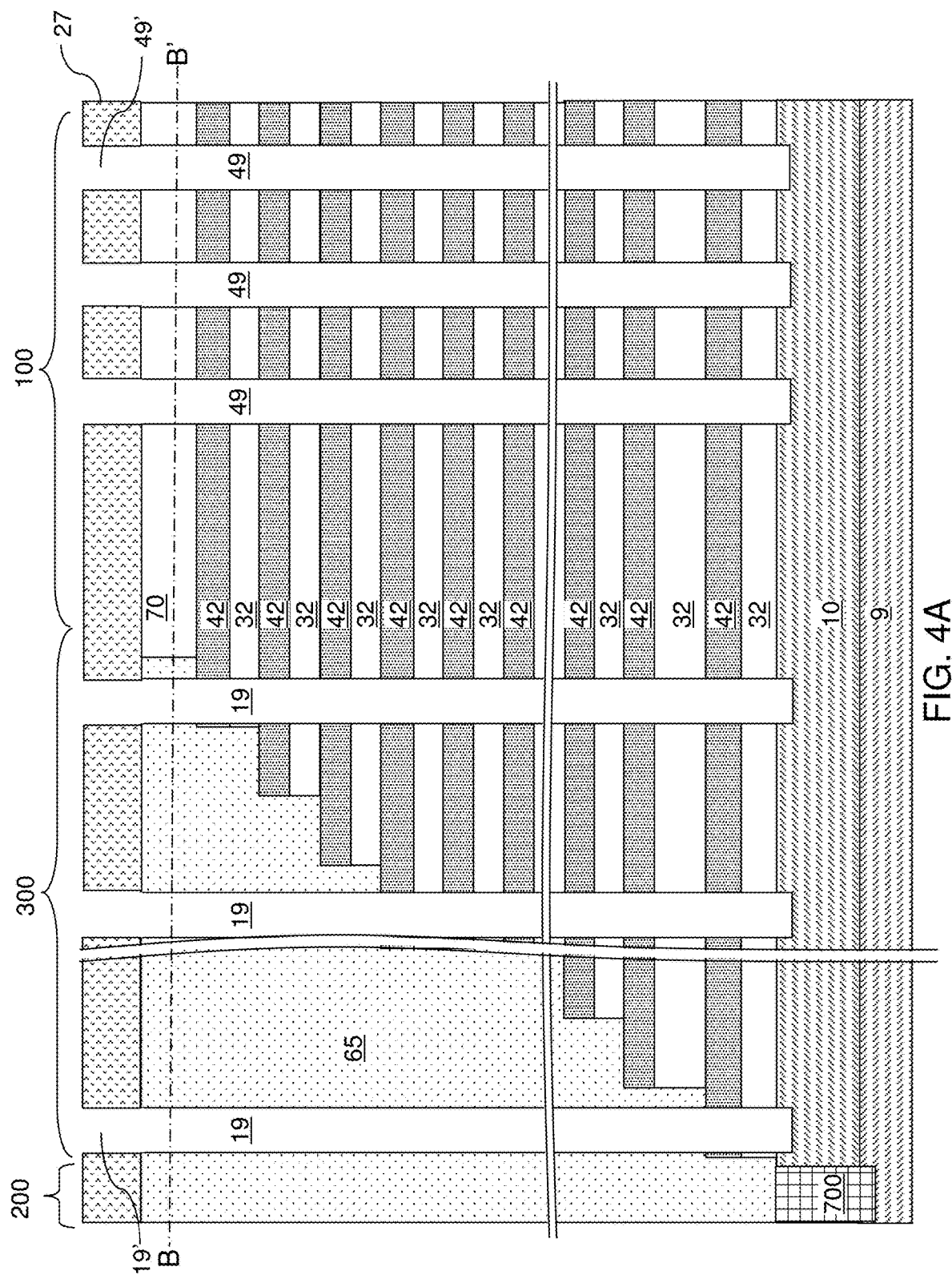
FIG. 4A is a schematic vertical cross-sectional view of the exemplary structure after formation of memory openings and support openings according to an embodiment of the present disclosure.
Figure 4B:
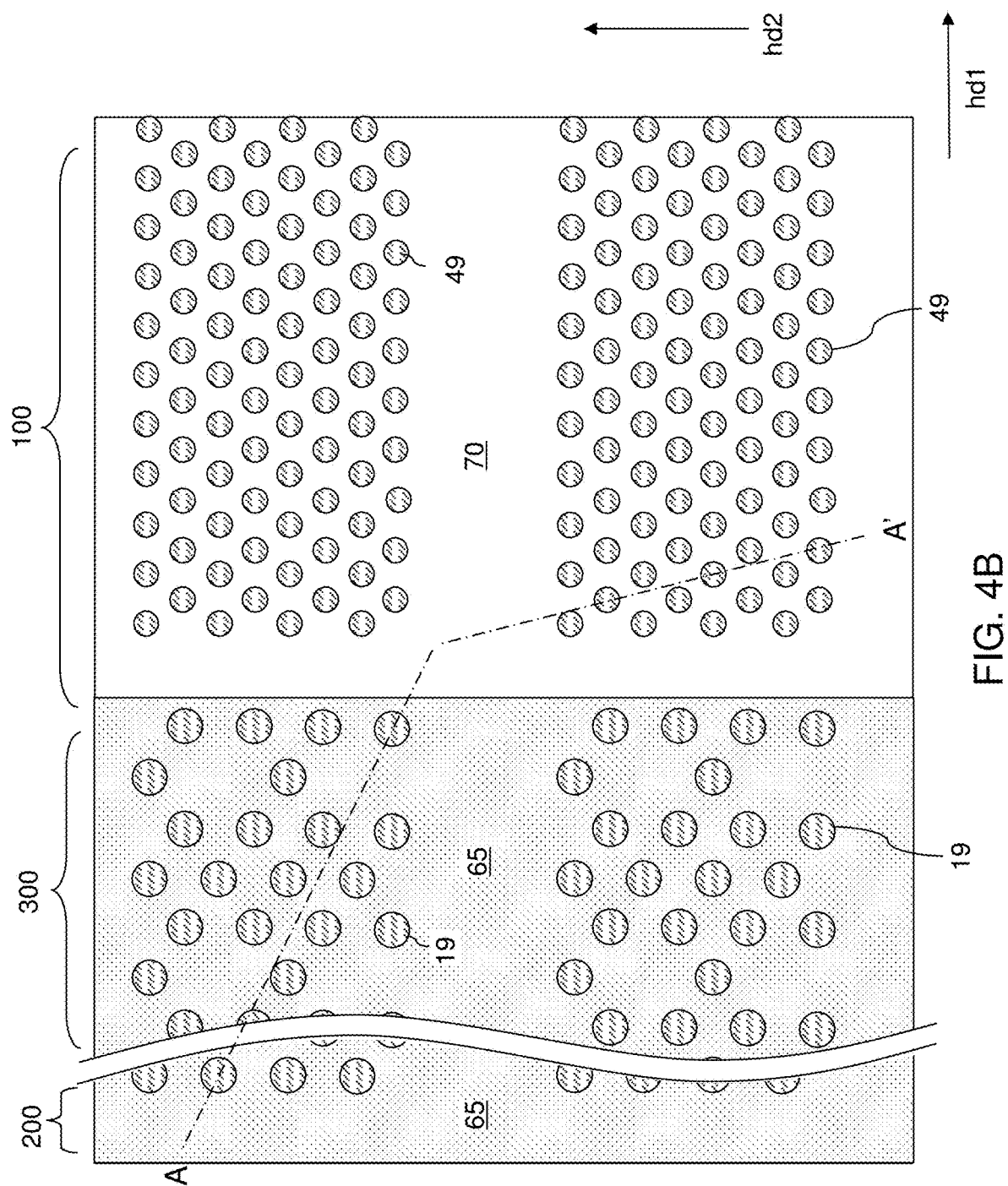
FIG. 4B is horizontal cross-sectional view along horizontal plane B-B' of the exemplary structure of FIG. 4A. The vertical plane A-A' is the plane of the cross-section for FIG. 4A.

Referring to FIGS. 4A and 4B, a lithographic material stack including at least a photoresist layer 27 can be formed over the insulating cap layer 70 and the retro-stepped dielectric material portion 65, and can be lithographically patterned to form openings therein. The openings include a first set of openings 49' formed over the memory array region 100 and a second set of openings 19' formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the respective openings 49' and 19' in the patterned lithographic material stack are etched to form respective memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed.

Generally, the memory openings 49 are formed through the alternating stack (32, 42) in the memory array region 100. The memory openings 49 are arranged in a first hexagonal array having a nearest-neighbor direction that is parallel to a first horizontal direction hd1. Support openings 19 are formed through the alternating stack (32, 42) in the staircase region 300 such that the support openings 19 are arranged in a second hexagonal array having a nearest-neighbor direction that is perpendicular to the first horizontal direction hd1. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 5:
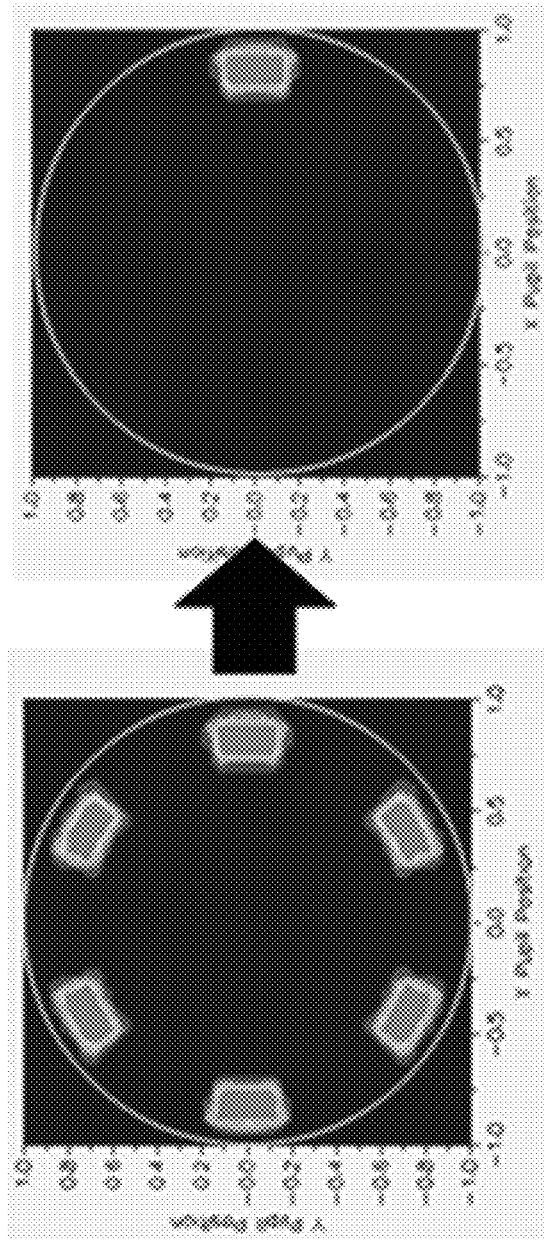
FIG. 5 is a shape of a first exemplary source and a first exemplary mono-pole analysis of the image of the first exemplary source on a pupil plane in the absence of diffractions for an ArF radiation source.

FIG. 5 illustrates a shape of a first embodiment exposure source of a lithographic exposure tool and a first embodiment mono-pole analysis of the image of the first embodiment source on a pupil plane in the absence of diffraction. The exposure source may be an ArF UV radiation (e.g., UV radiation) source for immersion lithography with a numerical aperture of 1.05. The first embodiment exposure source of the lithographic exposure tool may be employed to lithographically expose the photoresist layer 27 that is applied over the insulating cap layer 70 at the processing steps of FIGS. 4A and 4B. The lithographically exposed photoresist layer 27 can include a first pattern of first openings 49' and a second pattern of second openings 19'. The first pattern of the first openings 49' can be the same as the pattern of the memory openings 49, which is formed by transferring the first pattern of the first openings 49' in the patterned photoresist layer 27. The second pattern of the second openings 19' can be the same as the pattern of the support openings 19, which is formed by transferring the second pattern of the second openings 19' in the patterned photoresist layer 27.

Referring to FIGS. 6A-6C, 7A, 7B, 8A, and 8B, a comparative lithographic pattern is shown, which will be compared to the embodiment lithographic pattern in the photoresist layer 27 for forming the memory openings 49 and the support openings 19 in the embodiment structure of FIGS. 4A and 4B. The comparative lithographic pattern is an exposed photoresist layer 127 having openings (49", 19") to form a comparative structure having a different pattern of support openings 19 than the pattern of support openings 19 in the embodiment structure of FIGS. 4A and 4B. The memory openings 49 may have a smaller diameter and a smaller pitch (i.e., smaller nearest neighbor distance) than the support openings 19.

Figures 6A, 6B:
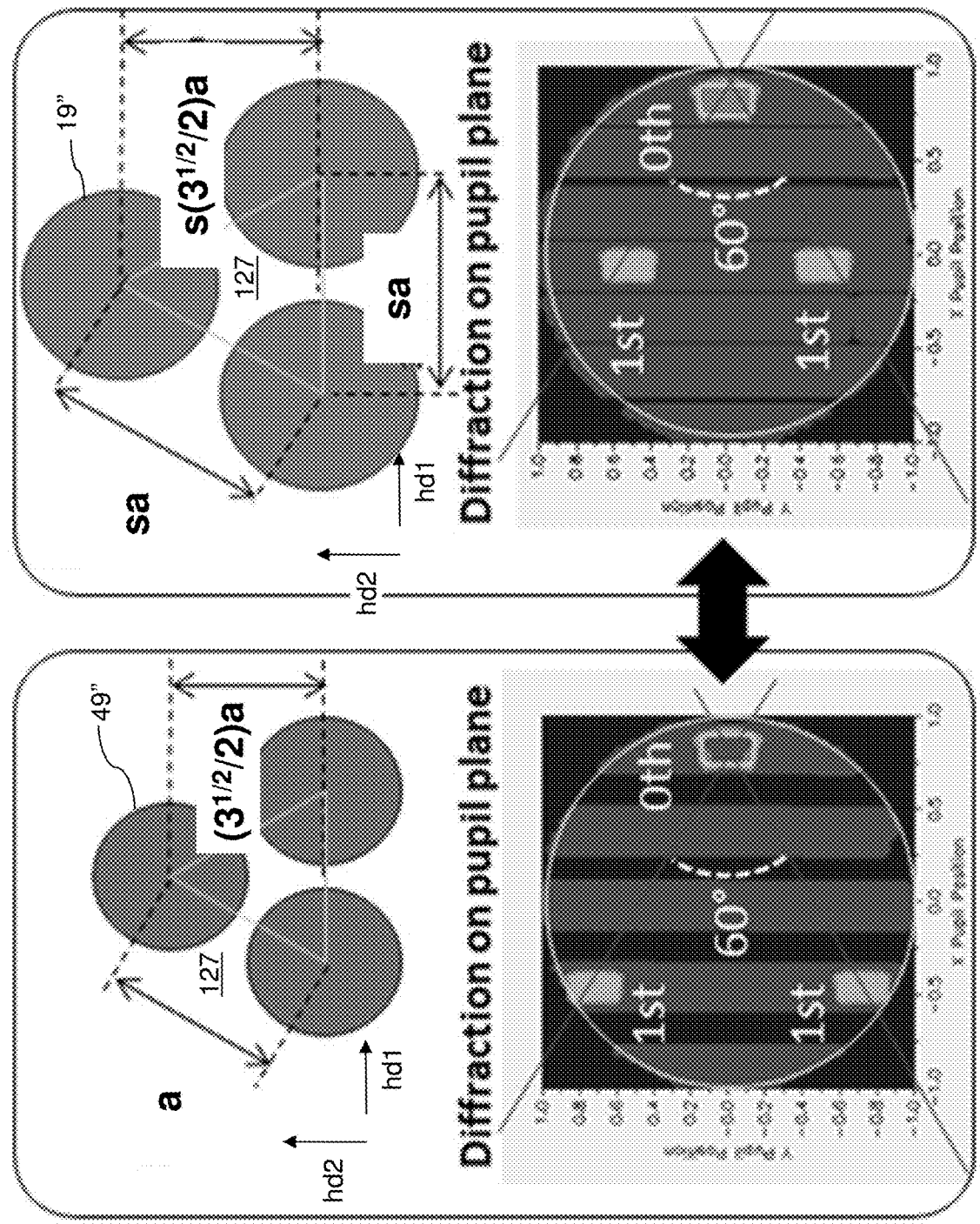
FIG. 6A is a mono-pole analysis of the image of the first exemplary source on a pupil plane for a lithographic pattern including a periodic hexagonal array of first openings having a nearest-neighbor pitch along the first horizontal direction.
FIG. 6B is a mono-pole analysis of the image of the first exemplary source on a pupil plane for a comparative lithographic pattern including a periodic hexagonal array of second openings having a nearest-neighbor pitch along the first horizontal direction.

Referring to FIG. 6A, a mono-pole analysis of the image of an ArF radiation source of an immersion lithography system on a pupil plane is illustrated for a first pattern of the first openings 49" within the comparative lithographic pattern (e.g., in a comparative immersion photoresist layer 127). The first pattern of the first openings 49" is used to etch the memory openings 49. The first pattern of the first openings 49" within the comparative lithographic pattern in the comparative photoresist layer 127 comprises a lithographic pattern including a periodic hexagonal array of circular openings 49". The periodic hexagonal array of openings 49" within the comparative lithographic pattern has a nearest-neighbor pitch along the first horizontal direction (e.g., word line direction) hd1. The pattern of the periodic hexagonal array of openings 49" within the comparative lithographic pattern in the comparative photoresist layer 127 is the same as the pattern of embodiment periodic array of first openings 49' within the lithographically exposed and developed embodiment photoresist layer 27 which is employed as an etch mask layer at the processing steps of FIGS. 4A and 4B. In one embodiment, the pattern of periodic array of first openings 49" within the comparative lithographic pattern can have a nearest-neighbor pitch a along the first horizontal direction hd1, along a horizontal direction that is azimuthally offset from the first horizontal direction hd1 by 60 degrees along a counterclockwise direction, and along a horizontal direction that is azimuthally offset from the first horizontal direction hd1 by 120 degrees along the counterclockwise direction.

Referring to FIG. 6B, a mono-pole analysis of the image of the an ArF radiation source of an immersion lithography system on a pupil plane is illustrated for the comparative lithographic pattern including a periodic hexagonal array of second openings 19" having a nearest-neighbor pitch sa along the first horizontal direction hd1. The second openings 19" within the comparative lithographic pattern (e.g., in an immersion photoresist layer 127) is used to etch the support openings 19. The pattern of periodic array of second openings 19" within the comparative lithographic pattern can have a nearest-neighbor pitch sa along the first horizontal direction hd1, along a horizontal direction that is azimuthally offset from the first horizontal direction hd1 by 60 degrees along a counterclockwise direction, and along a horizontal direction that is azimuthally offset from the first horizontal direction hd1 by 120 degrees along the counterclockwise direction.

The nearest-neighbor pitch sa in the comparative pattern of FIG. 6B differs from the nearest-neighbor pitch a in the embodiment pattern of FIG. 6A by a scaling factor s, which can be in a range from 1.25 to 1.70. In other words, the nearest-neighbor pitch sa in the comparative pattern of FIG. 6B is the product of the scaling factor s and the nearest-neighbor pitch a in the embodiment pattern of FIG. 6A. Therefore, the support opening 19 pitch sa is larger than the memory opening 49 pitch a by a factor of 1.25 to 1.70.

The comparative lithographic pattern of the second openings 19" used to etch the support openings 19 is different from the embodiment lithographic pattern of second openings 19' used to etch a regular hexagonal array of support openings 19 in the first embodiment structure of FIGS. 4A and 4B. Specifically, the comparative lithographic pattern of second openings 19" in the comparative photoresist layer 127 used to etch the comparative support openings 19 is azimuthally rotated with respect to the embodiment pattern of second openings 19' in the embodiment photoresist layer 27 used to etch the embodiment support openings 19 by 90 degrees. In contrast, the comparative lithographic pattern of first openings 49" in the comparative photoresist layer 127 used to etch the comparative memory openings 49 is not rotated with respect to the embodiment pattern of the first openings 49' in the embodiment photoresist layer 27 used to etch the embodiment memory openings 49 shown in FIGS. 4A and 4B.

The pattern of periodic array of second openings 19" within the comparative lithographic pattern can include multiple rows of second openings. Each row of second openings 19" can include a plurality of second openings arranged along the first horizontal direction hd1. The multiple rows of second openings 19" can be laterally spaced apart along the second horizontal direction hd2. The center-to-center distance between neighboring rows of second openings 19" along the second horizontal direction hd2 can be $3^{1/2}/2$ times the nearest-neighbor pitch sa within the comparative lithographic pattern.

In the comparative case in which the first pattern of the first openings 49" (which will be used to etch the comparative memory openings 49) in FIG. 6A and the second pattern of the second openings 19" (which will be used to etch the comparative support openings 19) illustrated in FIG. 6B are employed in a same lithographic exposure and are printed simultaneously. The difference between the nearest-neighbor pitch sa in the second pattern and nearest-neighbor pitch a in the first pattern makes optimization of lithographic processing parameters difficult during the exposure process. This is because the first order peaks in the pupil plane for the first openings and the first order peaks in the pupil plane for the second openings do not simultaneously provide constructive interference due to the scaling factor s being different from 1.

Figure 6C:
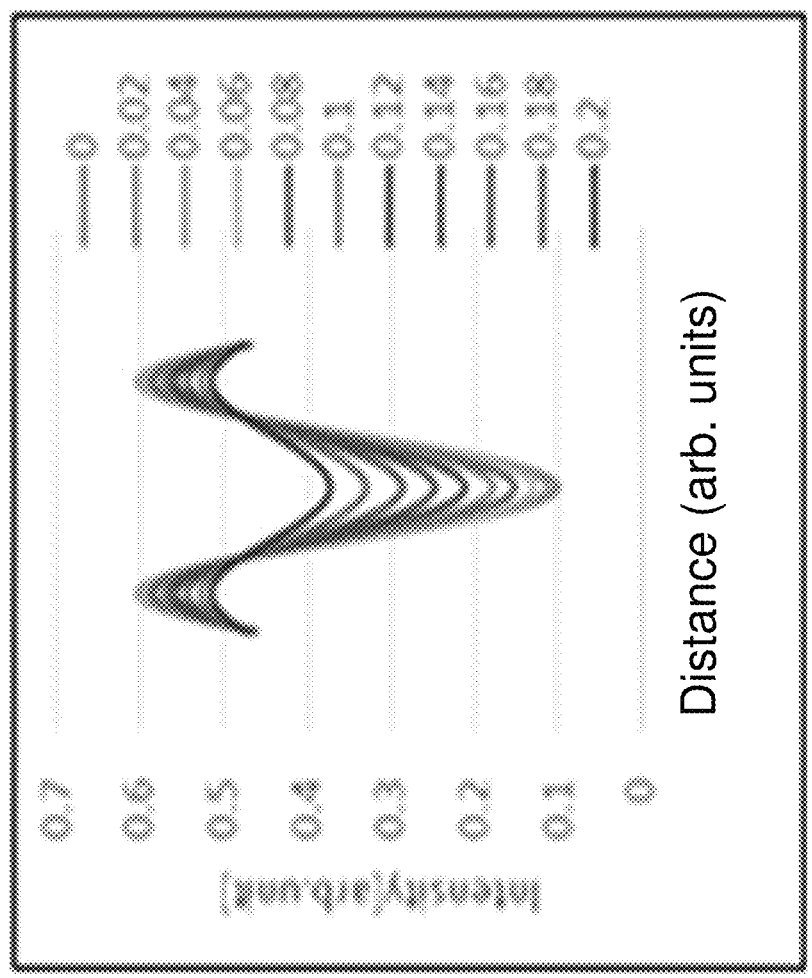
FIG. 6C is a graph illustrating variations in the intensity of the areal image for the periodic hexagonal array of the second openings of the comparative lithographic pattern of FIG. 6B as a function of focus offsets in a range from 0 micron to 0.2 microns.

Referring to FIG. 6C, a graph illustrating variations in the intensity of the areal image is illustrated for the periodic hexagonal array of the second openings 19" used to etch the support openings 19 of the comparative lithographic pattern of FIG. 6B as a function of focus offsets in a range from 0 micron to 0.2 microns in case the scaling factor s is 1.45 and in case the lithographic exposure conditions are optimized for printing the periodic hexagonal array of memory openings 49. A small focus offset less than 0.2 microns can significantly degrade the intensity variations in the comparative photoresist layer 127 for the purpose of printing the image for the periodic hexagonal array of second openings 19" used to etch the support openings 19 of the comparative lithographic pattern of FIG. 6B. Thus, the combination of the lithographic pattern of FIG. 6A and the comparative lithographic pattern of FIG. 6B into a same lithographic exposure process that is optimized for printing the lithographic pattern of FIG. 6A can result in significant image degradation and small lithographic process window for the comparative lithographic pattern of FIG. 6B.

Figure 7B:
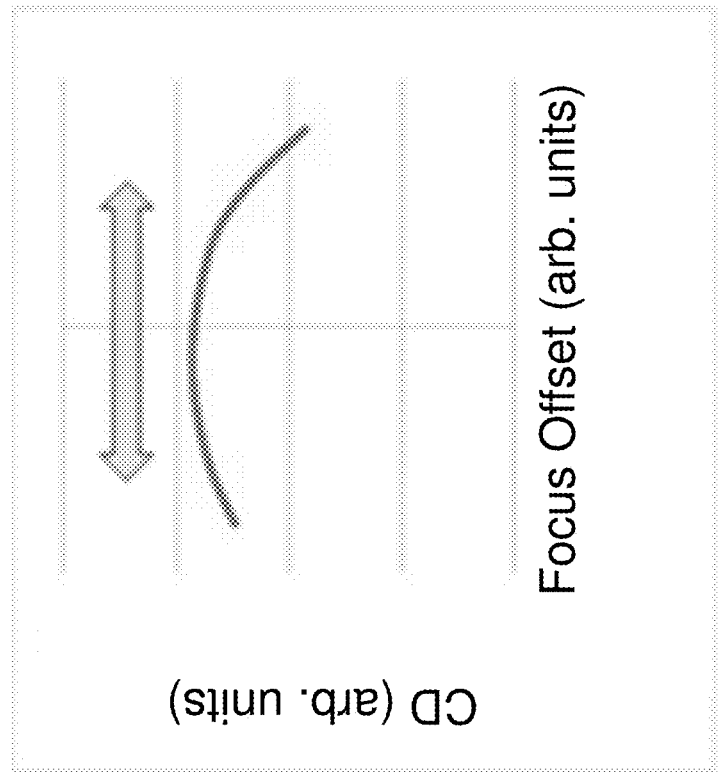
FIG. 7B is a graph illustrating the critical dimension (CD) of a memory opening as a function of a focus offset during printing of the pattern of the periodic hexagonal array of memory openings illustrated in FIG. 7A.
Figure 7A:
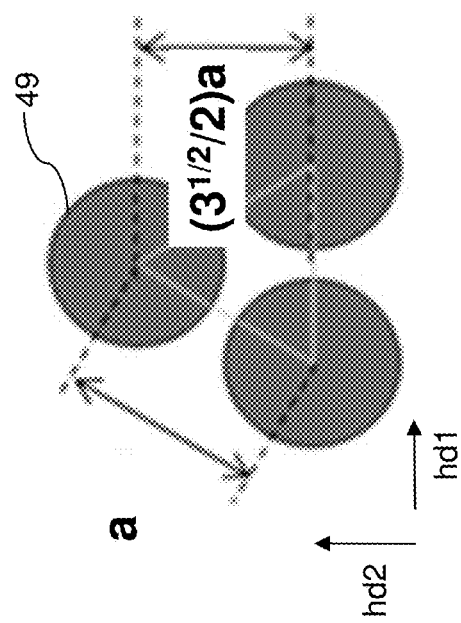
FIG. 7A is a top-down view of a portion of the periodic hexagonal array of memory openings having a nearest-neighbor pitch along the first horizontal direction in a comparative structure.

Referring to FIG. 7A, a top-down view of a portion of the periodic hexagonal array of memory openings 49 having a nearest-neighbor pitch a along the first horizontal direction in the comparative structure is illustrated. As discussed above, the comparative structure is derived from the embodiment structure of FIGS. 4A and 4B by employing the lithographic pattern of FIG. 6B in lieu of the lithographic pattern for forming the support openings 19 illustrated in FIGS. 4A and 4B.

Referring to FIG. 7B, a graph illustrates the critical dimension (CD) of a memory opening 49 as a function of a focus offset during printing of the pattern of the periodic hexagonal array of memory openings illustrated in FIG. 7A. Upon optimization of lithographic exposure parameters in a lithographic exposure process employing an ArF radiation source, the depth of focus for the lithographic exposure process for the purpose of printing the first pattern of the first openings (i.e., the periodic hexagonal array of memory openings 49 illustrated in FIG. 7A) in the comparative structure may be relatively large.

Figure 8B:
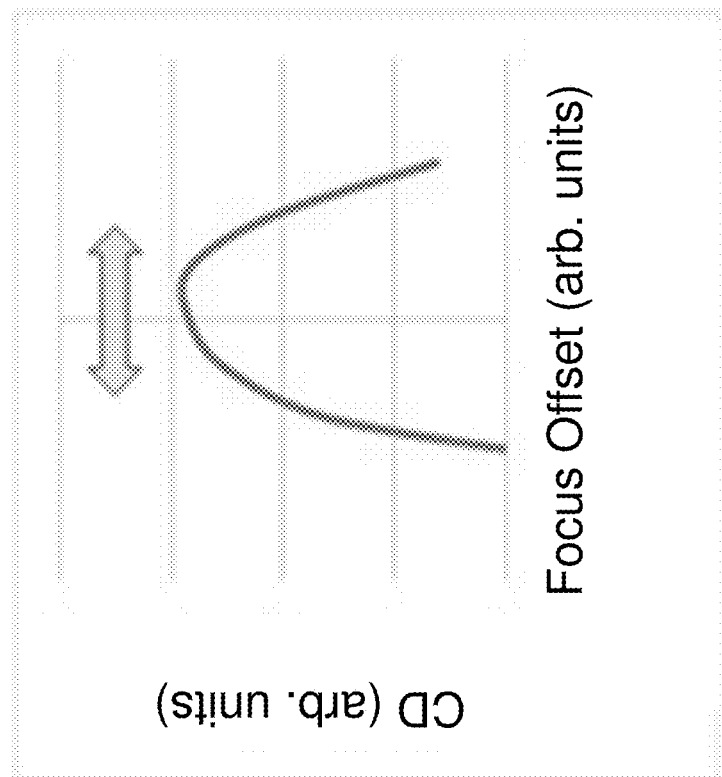
FIG. 8B is a graph illustrating the critical dimension (CD) of a support opening as a function of a focus offset during printing of the pattern of the periodic hexagonal array of support openings illustrated in FIG. 8A.
Figure 8A:
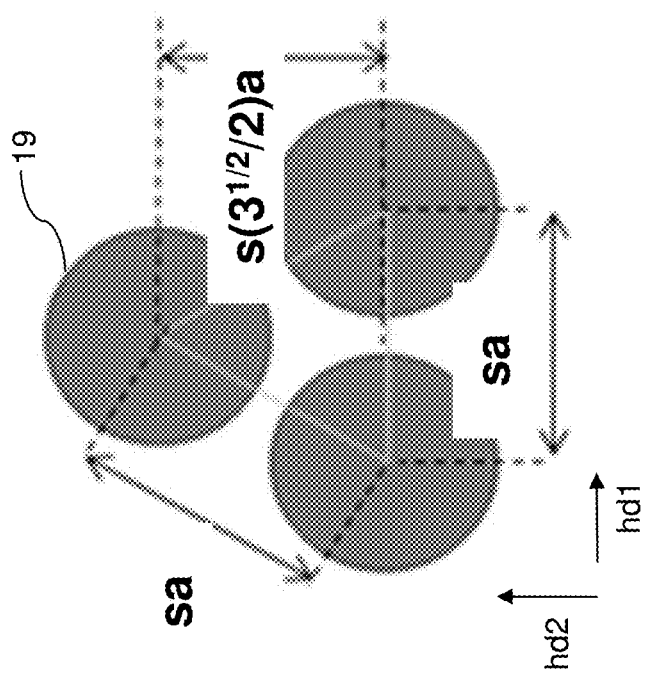
FIG. 8A is a top-down view of a portion of a periodic hexagonal array of support openings having a nearest-neighbor pitch along the first horizontal direction in the comparative structure.

Referring to FIG. 8A, a top-down view of a portion of a periodic hexagonal array of support openings 19 having a nearest-neighbor pitch sa along the first horizontal direction in the comparative structure is illustrated.

Referring to FIG. 8B, a graph illustrates the critical dimension (CD) of a support opening 19 as a function of a focus offset during printing of the pattern of the periodic hexagonal array of support openings illustrated in FIG. 8A. Upon optimization of lithographic exposure parameters in a lithographic exposure process employing an ArF radiation source, the depth of focus for the lithographic exposure process for the purpose of printing the second pattern of the second openings (i.e., the periodic hexagonal array of support openings 19 illustrated in FIG. 8A) may be at least two times smaller than the depth of focus for the memory openings 49 in FIG. 7B.

Generally, the pattern of the memory openings 49 is a more important pattern because memory cells are subsequently formed in the memory openings 49, and the pattern of the support openings 19 is less important because the support openings 19 are filled with electrically inactive components. However, as device scaling continues, the pattern of the support openings 19 should be to be printed with high fidelity to enhance memory device performance. While the focus margin of the second pattern of openings 19" may be improved through use of a lower numerical aperture (NA) condition and/or through use of sub-resolution assist features (SRAFs), such an approach does not drastically increase the lithographic process widow for a lithographic exposure process for simultaneously exposing the first pattern of first openings 49" and the second pattern of second openings 19".

Further, in case an aggressive off axis illumination, such as an illumination process employing a hexa-poles source, simultaneous printing of the first pattern of first openings 49" and the second pattern of second openings 19" in the comparative photoresist layer 127 becomes very difficult. Thus, scaling of the nearest-neighbor pitch a for the first pattern of the first openings 49" cannot be effectively pursued through use of off-axis illumination in case of the comparative lithographic pattern discussed with reference to FIGS. 6A-6C, 7A and 7B, and 8A and 8B is employed.

According to an aspect of the present disclosure, the lithographic pattern in the embodiment photoresist layer 27 that can be employed to form the embodiment structure illustrated in FIGS. 4A and 4B is discussed with reference to FIGS. 9A, 9B, 10A and 10B, 11A and 11B, 12, 13A and 13B, and 14-17. Specifically, the lithographic pattern in the embodiment photoresist layer 27 of the embodiment structure of FIGS. 4A and 4B can include the first pattern of first openings 49' that is the same as the first pattern of first openings 49" illustrated in FIG. 6A and a second pattern of second openings 49' derived from the second pattern of second openings 49" illustrated in FIG. 6B by azimuthal rotation of the second pattern of second openings 19" by 90 degrees either clockwise or counterclockwise. The number of rows of the second openings 19' and the length of each row of second openings can be adjusted to fit into the area of the staircase region 300 with gaps laterally extending along the first horizontal direction hd1 as illustrated in FIG. 4B.

The first pattern of first openings 49' in the embodiment lithographic pattern in the embodiment photoresist layer 27 according to an embodiment of the present disclosure is illustrated in FIG. 9A. A second pattern of second openings 19' in the embodiment lithographic pattern the embodiment photoresist layer 27 according to an embodiment of the present disclosure is illustrated in FIG. 9B. The lithographic pattern that is developed in the embodiment photoresist layer 27 at the processing steps of FIGS. 4A and 4B includes the first pattern of first openings 49' of FIG. 9A in the memory array region 100, and includes the second pattern of second openings 19' of FIG. 9B in the staircase region 300.

The nearest-neighbor pitch sa in the embodiment pattern of FIG. 9B differs from the nearest-neighbor pitch a in the embodiment pattern of FIG. 9A by a scaling factor s, which can be in a range from 1.25 to 1.70. In other words, the nearest-neighbor pitch sa in the comparative pattern of FIG. 9B is the product of the scaling factor s and the nearest-neighbor pitch a in the embodiment pattern of FIG. 9A.

The pattern of periodic array of second openings 19' within the embodiment lithographic pattern in the embodiment photoresist layer 27 employed at the processing steps of FIGS. 4A and 4B can include multiple rows of second openings. Each row of second openings can include a plurality of second openings 19' arranged along the second horizontal direction hd2. The multiple rows of second openings 19' can be laterally spaced apart along the first horizontal direction hd1. The center-to-center distance between neighboring rows of second openings 19' along the first horizontal direction hd1 can be $3^{1/2}/2$ times the nearest-neighbor pitch sa within the embodiment lithographic pattern of FIG. 9B.

Generally, a lithographic mask employed for lithographic exposure of the embodiment photoresist layer (e.g., immersion photoresist layer) 27 in the embodiment structure of FIGS. 4A and 4B includes the first pattern of the first openings 49' and the second pattern of the second openings 19'. The lithographic mask is employed during a single lithographic exposure process to transform the source beam into an illumination beam having an illumination pattern that impinges on the photoresist layer 27. A first component of the illumination pattern for printing the first pattern is generated by interference of three beams including a zeroth-order beam and two first-order beams within the illumination beam as illustrated in FIG. 6A. A second component of the illumination pattern for printing the second pattern is generated by interference of three beams including a zeroth-order beam and two first-order beams within the illumination beam as illustrated in FIG. 6B.

In case the lithographic pattern in the photoresist layer 27 includes an embodiment lithographic pattern containing a periodic hexagonal array of first openings 49' used to etch memory openings 49 having a first nearest-neighbor pitch a along the first horizontal direction hd1 and containing a periodic hexagonal array of second openings 19' used to etch support openings 19 having a second nearest-neighbor pitch sa along the first horizontal direction hd1, then the memory openings 49 can have horizontal cross-sectional shapes of a first circle having a first diameter a at a horizontal plane including a topmost surface of the alternating stack (32, 42), and the support openings 19 can have horizontal cross-sectional shapes of a second circle having a second diameter sa at the horizontal plane. The second diameter sa is greater than the first diameter a. The ratio of the second diameter sa to the first diameter a can be in a range from 1.25 to 1.70. In other words, the scaling factor s may be in a range from 1.25 to 1.70.

In one embodiment, the memory openings 49 have horizontal cross-sectional shapes of a first circle having a first diameter at a horizontal plane including a topmost surface of the alternating stack (32, 46), the support openings 19 have horizontal cross-sectional shapes of a second circle having a second diameter at the horizontal plane, and the second diameter is greater than the first diameter. In one embodiment, the ratio of the second diameter to the first diameter is in a range from 1.25 to 1.70.

Generally, the memory openings 49 and the support openings 19 in the embodiment structure of FIGS. 4A and 4B can be formed by forming a photoresist layer 27 over the alternating stack (32, 42), and patterns of openings can be formed in the photoresist layer by lithographically patterning the photoresist layer 27. The pattern of openings in the photoresist layer can comprise a first pattern of first openings (which are herein referred to as memory-region openings) 49' having a same pattern as a pattern of the memory openings 49, and a second pattern of second openings (which are herein referred to as staircase-region openings) 19' having a same pattern as a pattern of the support openings 19.

The first pattern of first openings 49' can be the same as the pattern of the periodic horizontal hexagonal array of memory openings 49, and the second pattern of second openings 19' can be the same as the pattern of the periodic horizontal hexagonal array of support openings 19. The first pattern of first openings 49' can have the periodicity illustrated in FIG. 9A, and the second pattern of second openings 19' can have the periodicity illustrated in FIG. 9B. Generally, the first pattern of memory-region openings 49' and the second pattern of staircase-region openings 19' can be simultaneously formed by a combination of a single lithographic exposure process and a single lithographic development process on the same photoresist layer 27.

Subsequently, the patterns of openings (49', 19') in the photoresist layer 27 can be transferred through the alternating stack (32, 42) by performing an anisotropic etch process. In one embodiment, the anisotropic etch process simultaneously etches the memory openings 49 and the support openings 19 through the alternating stack (32, 42). In one embodiment, the single lithographic exposure process generates a source radiation employing off-axis illumination generated from a hexa-pole radiation source.

Figure 10A:
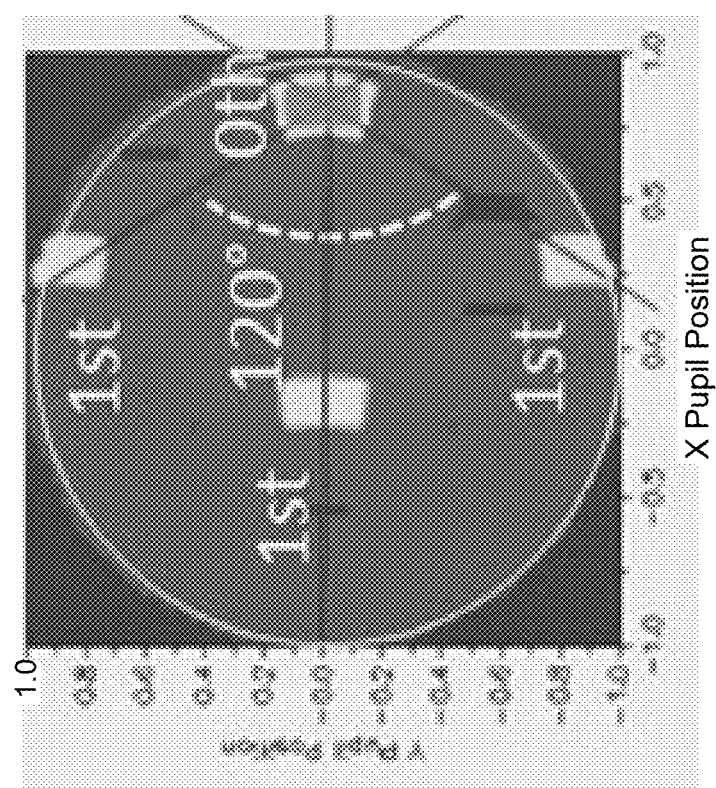
FIG. 10A is a mono-pole analysis of the image of the first exemplary source on a pupil plane for the embodiment lithographic pattern including a periodic hexagonal array of second openings having a nearest-neighbor pitch along the second horizontal direction within the exemplary structure of FIGS. 4A and 4B.

Referring to FIG. 10A, a mono-pole analysis of the image of the first embodiment source of FIG. 5 on a pupil plane is shown for the embodiment lithographic pattern including a periodic hexagonal array of support openings 19 having a nearest-neighbor pitch sa along the second horizontal direction hd2 within the embodiment structure of FIGS. 4A and 4B.

A lithographic mask is employed during a single lithographic exposure process to transform the source beam into an illumination beam having an illumination pattern that impinges on the photoresist layer 27. According to an aspect of the present disclosure, a first component of the illumination pattern for printing the first pattern of first openings illustrated in FIG. 9A can be generated by interference of three beams including a zeroth-order beam and two first-order beams within the illumination beam as illustrated in FIG. 6A, and second component of the illumination pattern for printing the second pattern is generated by interference of four beams including the three beams and an additional first-order beam within the illumination beam as illustrated in FIG. 10A.

Figure 10B:
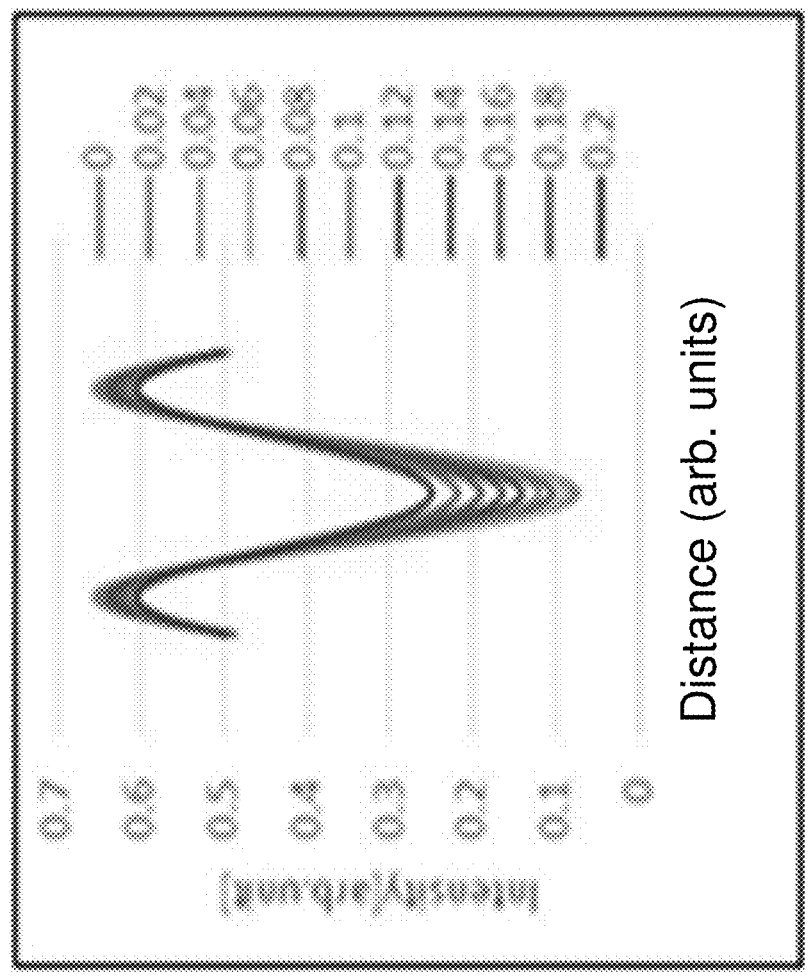
FIG. 10B is a graph illustrating variations in the intensity of the areal image for the periodic hexagonal array of the second openings of the embodiment exemplary lithographic pattern of FIG. 10A as a function of focus offsets in a range from 0 micron to 0.2 microns in case the first exemplary source is employed.

The areal image of the second pattern in the photoresist layer 27 can be stable with respect to a focus offset change upon selection of optimized lithographic process parameters for printing the first pattern in the photoresist layer 27. FIG. 10B illustrates that the focus margin is drastically improved relative to the case illustrated in FIG. 6C. Specifically, the variations in the intensity of the illumination beam is sufficient to print the second pattern of second openings 19' with high fidelity even if the focus offset varies by 0.2 microns.

Figure 11B:
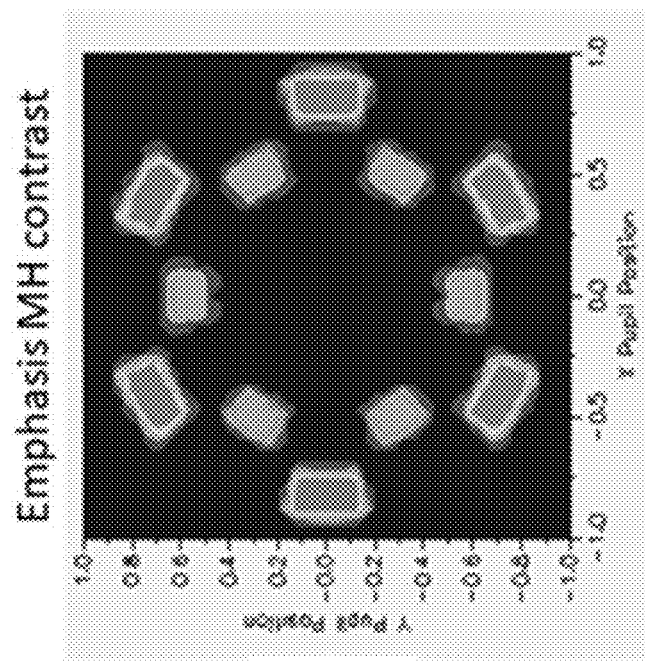
FIG. 11B is a third exemplary source shape that may be employed to print the lithographic pattern for the memory openings and the support openings illustrated in FIGS. 4A and 4B.
Figure 11A:
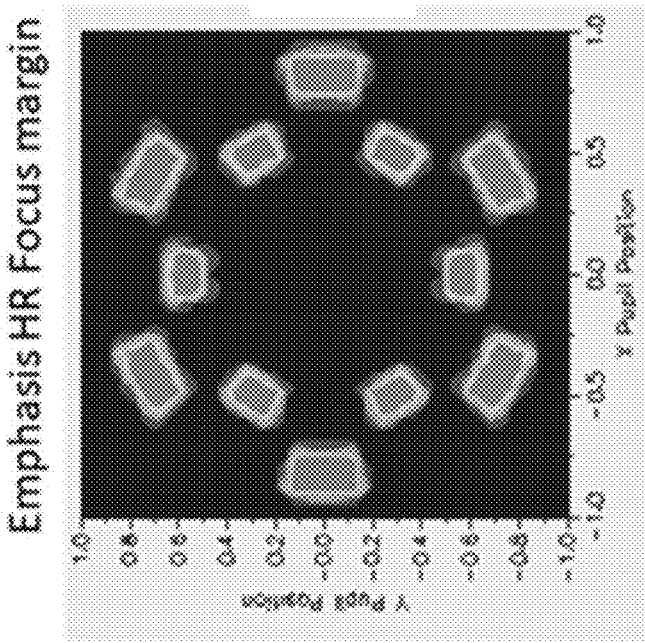
FIG. 11A is a second exemplary source shape that may be employed to print the lithographic pattern for the memory openings and the support openings illustrated in FIGS. 4A and 4B.

Referring to FIG. 11A and according to an aspect of the present disclosure, a second embodiment source shape is illustrated, which may be employed to print the embodiment lithographic pattern for the memory openings 49 and the support openings 19 illustrated in FIGS. 4A and 4B. The second embodiment source shape is a shape of a dual hexa-pole source including a first hexa-pole radiation source and a second hexa-pole radiation source having the same or comparable radiation intensities.

Referring to FIG. 11B and according to an aspect of the present disclosure, a third embodiment source shape is illustrated, which may be employed to print the embodiment lithographic pattern for the memory openings 49 and the support openings 19 illustrated in FIGS. 4A and 4B. The third embodiment source shape is a shape of a dual hexa-pole source including a primary hexa-pole radiation source and an auxiliary hexa-pole radiation source having a lesser radiation intensity than the primary hexa-pole radiation source.

Figure 12:
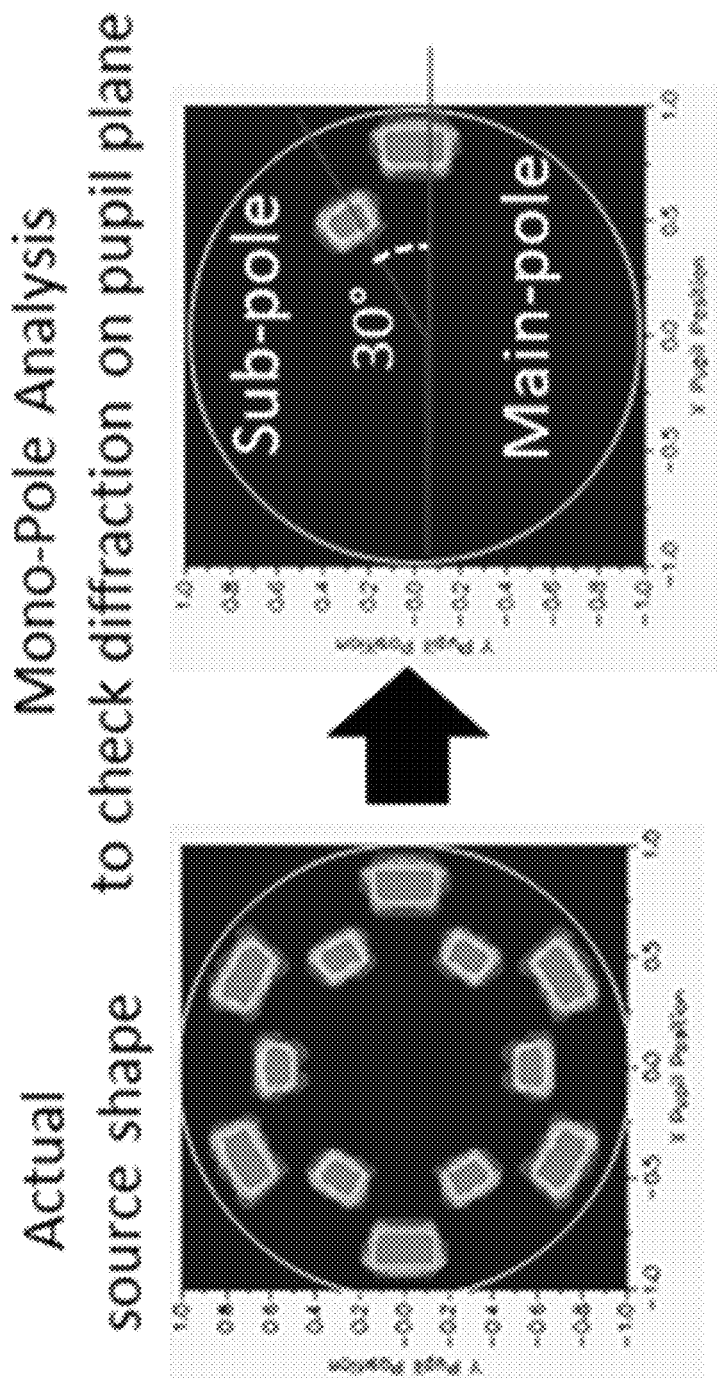
FIG. 12 is the second exemplary source shape and a second exemplary mono-pole analysis of the image of the second exemplary source on a pupil plane in the absence of diffractions for an ArF radiation source.

FIG. 12 illustrates the second embodiment source shape and a second embodiment mono-pole analysis of the image of the second embodiment source on a pupil plane in the absence of diffractions for an ArF radiation source. The first hexa-pole radiation source generates a main pole on the pupil plane, and the second hexa-pole radiation source generates a 30-degree subpole.

Figure 13B:
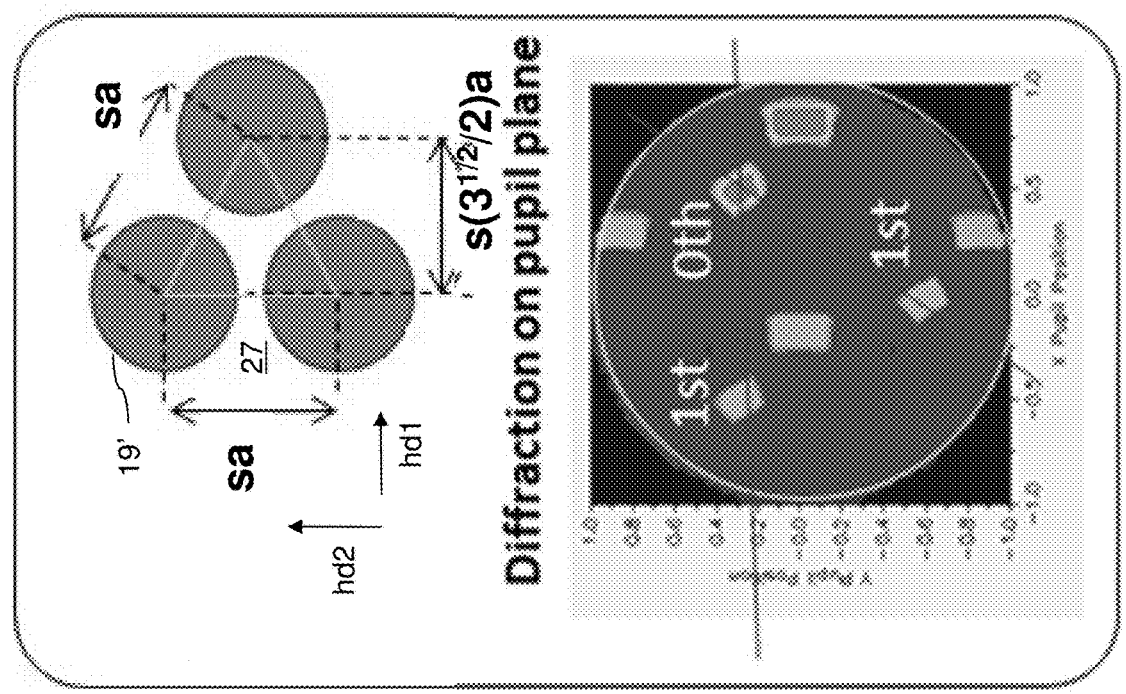
FIG. 13B is a mono-pole analysis of the image of the second exemplary source on a pupil plane for the exemplary lithographic pattern including a periodic hexagonal array of second openings having a nearest-neighbor pitch along the first horizontal direction.
Figure 13A:
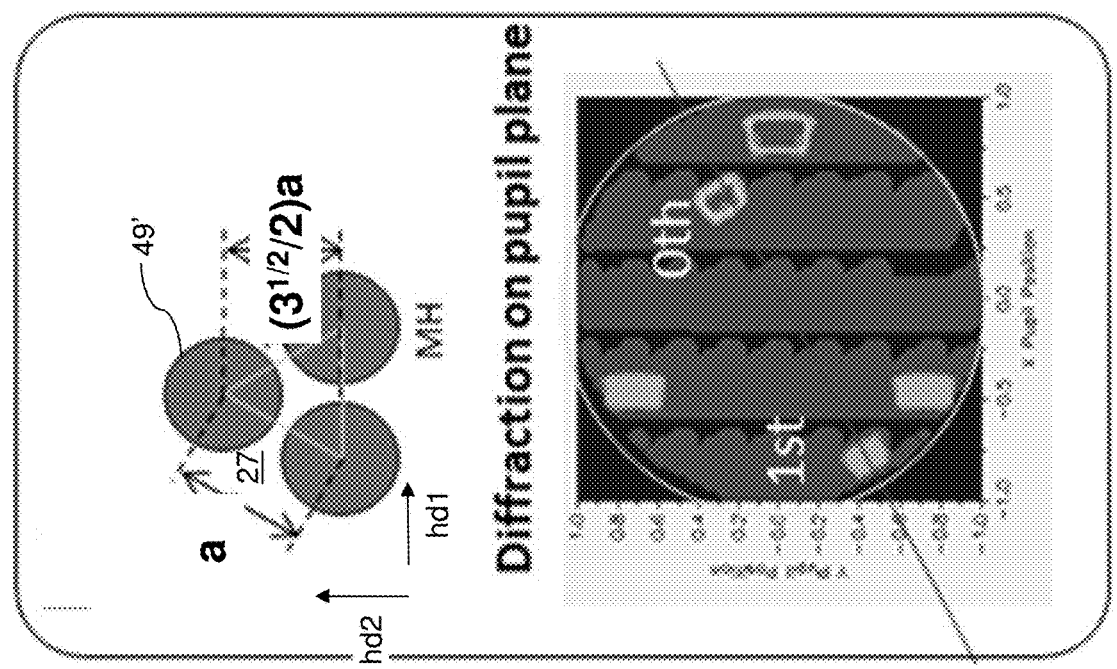
FIG. 13A is a mono-pole analysis of the image of the second exemplary source on a pupil plane for an exemplary lithographic pattern including a periodic hexagonal array of first openings having a nearest-neighbor pitch along the first horizontal direction.

FIG. 13A is a mono-pole analysis of the image of the second embodiment source on a pupil plane for a lithographic pattern including a periodic hexagonal array of first openings 49' used to etch memory openings 49 and having a nearest-neighbor pitch along the first horizontal direction. The first order peak generated from the 30-degree subpole can coincide with a diffraction peak of the first pattern of the first openings in the lithographic pattern in the photoresist layer 27 employed at the processing steps of FIGS. 4A and 4B, and thus, can provide constructive interference. Thus, the printed image of the first pattern can become sharper.

FIG. 13B is a mono-pole analysis of the image of the second embodiment source on a pupil plane for the embodiment lithographic pattern including a periodic hexagonal array of second openings 19' used to etch the support openings 19 and having a nearest-neighbor pitch along the first horizontal direction.

Figure 14:
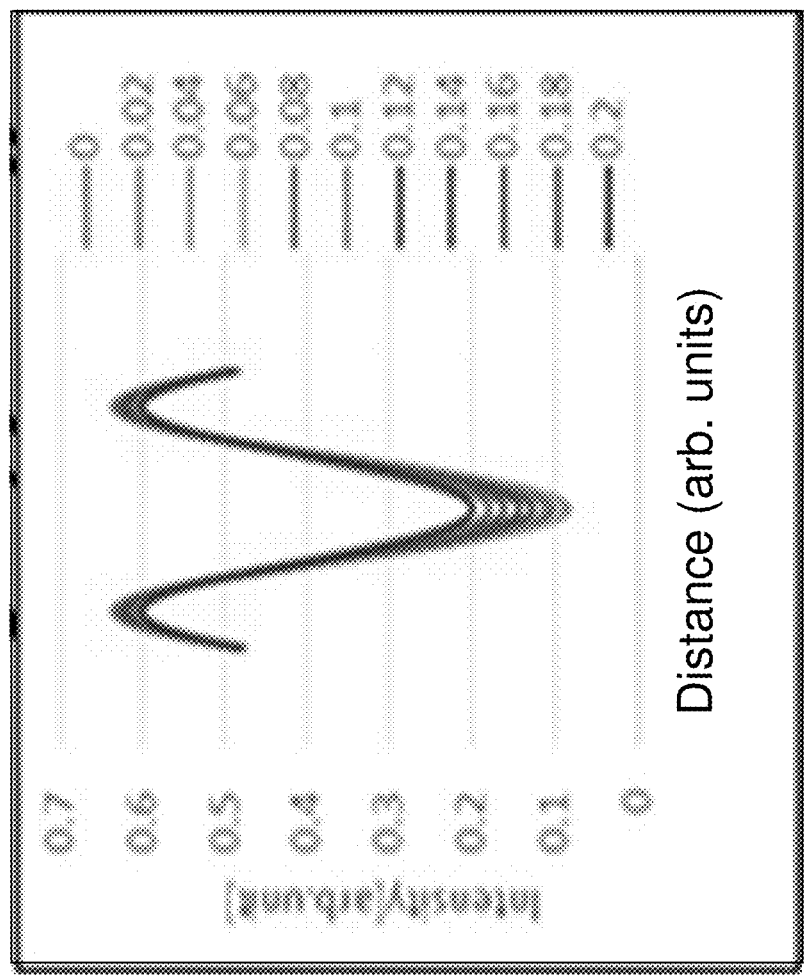
FIG. 14 is a graph illustrating variations in the intensity of the areal image for the periodic hexagonal array of second openings of the embodiment exemplary lithographic pattern of FIG. 13B as a function of focus offsets in a range from 0 micron to 0.2 microns in case the second exemplary source is employed.

FIG. 14 is a graph illustrating variations in the intensity of the areal image for the periodic hexagonal array of the second openings 19' of the embodiment lithographic pattern of FIG. 13B as a function of focus offsets in a range from 0 micron to 0.2 microns in case the second embodiment source is employed. The variations in the intensity of the illumination beam is sufficient to print the second pattern with high fidelity even if the focus offset varies by 0.2 microns.

Generally, any of the first embodiment source shape of FIG. 5, the second embodiment source shape of FIG. 11A, or the third embodiment source shape of FIG. 11B may be employed to induce constructive interference between the main pole, the 30-degree sub-pole, and the various first order peaks, and to enhance the lithographic process window (such as the depth of focus).

Generally, the first pattern of the first openings in FIG. 9A and the second pattern of the second openings illustrated in FIG. 9B are employed in a same lithographic exposure and are printed simultaneously. The 90 degree difference between the direction of the nearest-neighbor periodicity a in the first pattern and the direction of the nearest-neighbor periodicity sa in the second pattern enable constructive interferences between the various zeroth-order poles (such as the main pole and the 30-degree sub-pole) and the various first order peaks, and the lithographic process window can be expanded.

Figure 15:
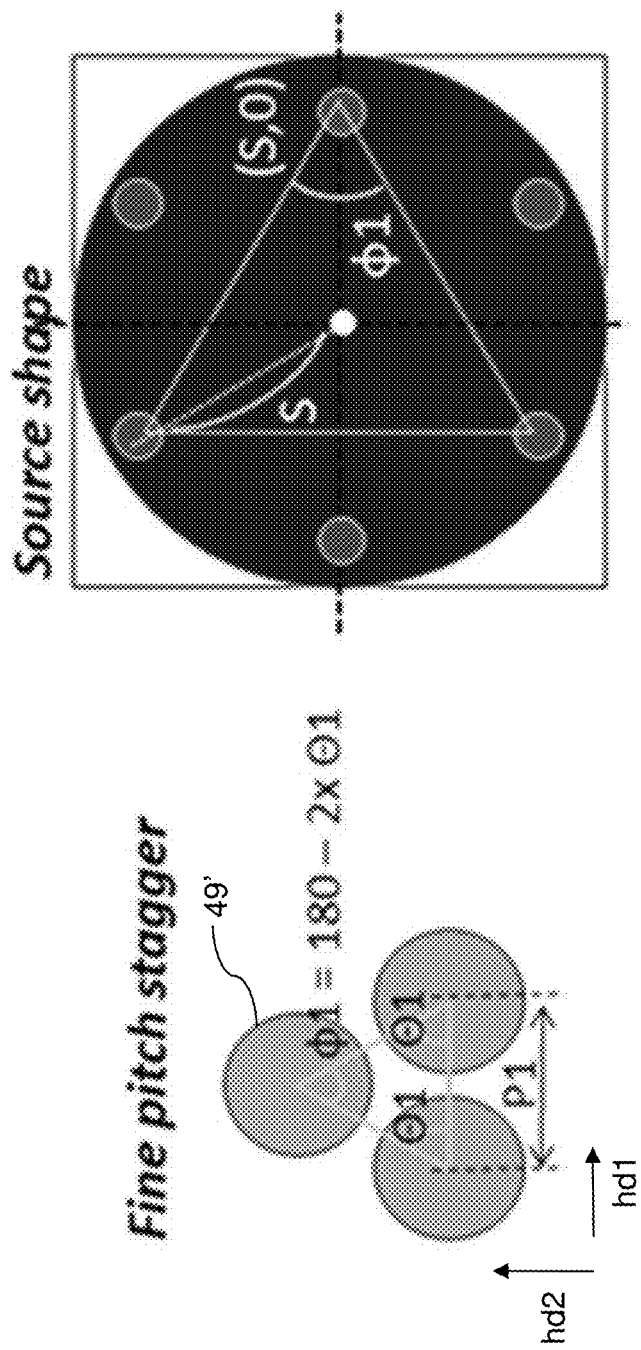
FIG. 15 illustrates a process of source shape optimization according to an embodiment of the present disclosure.
Figure 16:
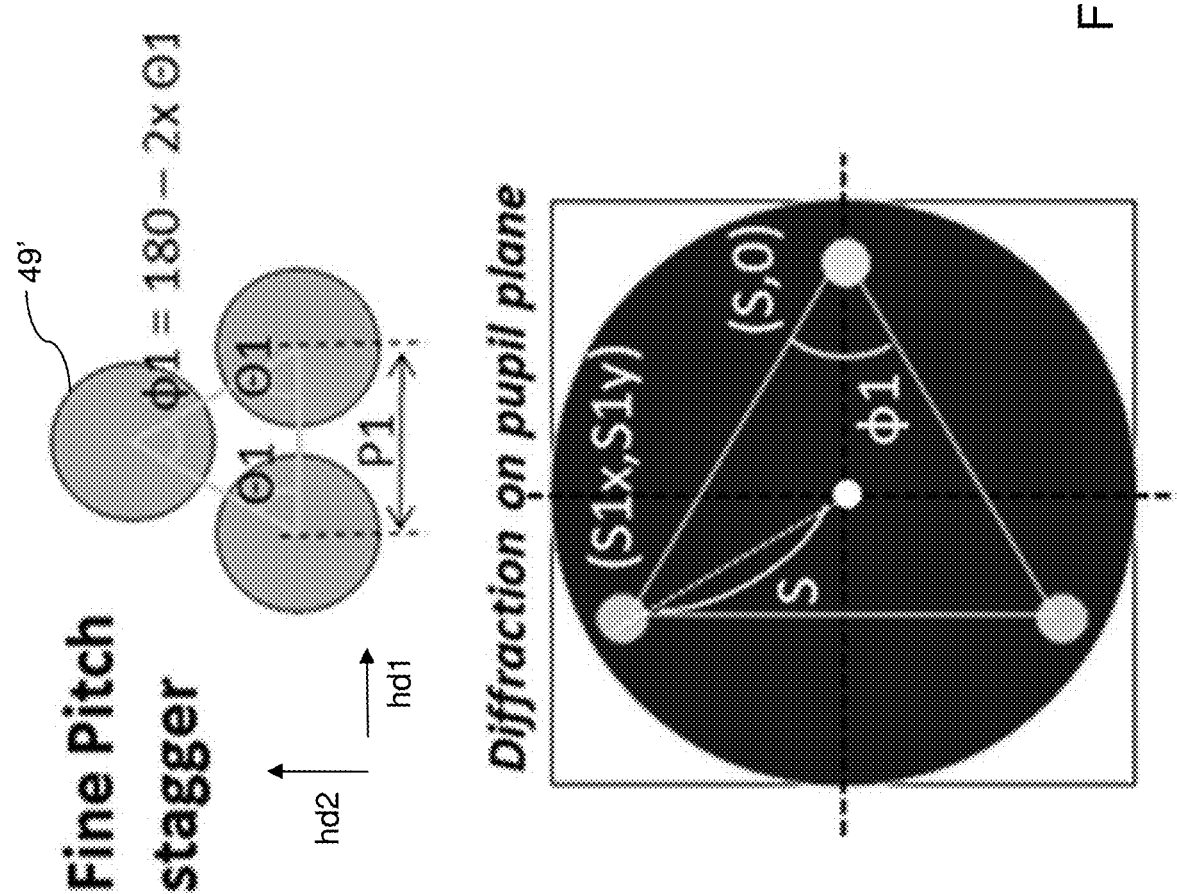
FIG. 16 illustrates a process of optimization for pole locations and numerical aperture for a fine pitch stagger pattern according to an embodiment of the present disclosure.

According to an aspect of the present disclosure, lithographic exposure conditions can be optimized employing a series of processing steps illustrated in FIGS. 14-16.

Referring to FIG. 15, a source shape can be determined by providing a symmetric hexa-pole shape. The angles can have the configuration of staggered pattern angles.

Referring to FIG. 16, the pole locations and the numerical aperture can be optimized for a fine pitch stagger pattern according to an embodiment of the present disclosure. The fine pitch stagger pattern is the first pattern of the first openings 49', of which a region is illustrated in FIG. 13A. The fine pitch is the nearest-neighbor pitch a of the first pattern along the first horizontal direction hd1. The pole location and the numerical aperture can be optimized for fine pitch stagger pattern from the viewpoint of diffraction balance on pupil plane.

The Exemplary Formulas are:

$$S1x = S - \frac{\lambda}{P1 \times NA}$$

$$S1y = \frac{\lambda}{P1 \times NA} \times \tan\frac{\varphi1}{2}$$

$$S = \sqrt{S1x^2 + S1y^2}$$

$$S = \sqrt{\left(S - \frac{\lambda}{P1 \times NA}\right)^2 + \left(\frac{\lambda}{P1 \times NA} \times \tan\frac{\varphi1}{2}\right)^2}$$

In the above formulas, $\lambda$ represents the wavelength of the source, NA represents the numerical aperture of the source, S represents the sigma center of each hexa-pole.

Figure 17:
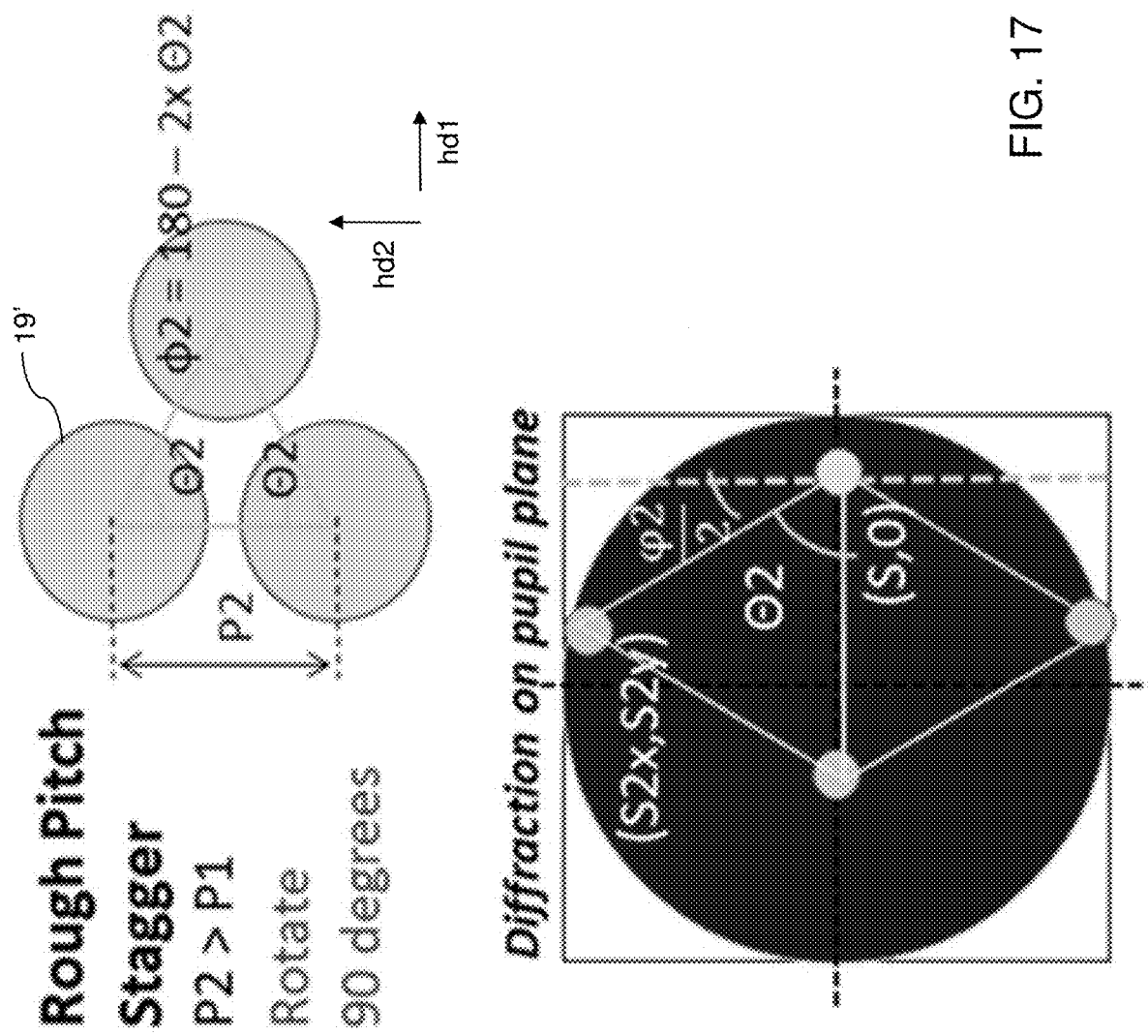
FIG. 17 illustrates a process of optimization for pole locations and numerical aperture for a rough pitch stagger pattern according to an embodiment of the present disclosure.

Referring to FIG. 17, pole locations and numerical aperture are verified for a rough pitch stagger pattern according to an embodiment of the present disclosure. The rough pitch stagger pattern is the second pattern of the second openings 19', of which a region is illustrated in FIG. 13B. The rough pitch is $3^{1/2}/2$ times the nearest-neighbor pitch sa of the second pattern along the second horizontal direction hd2. If the diffraction count on pupil plane is only 2, pole location and the numerical aperture needs adjustment The Exemplary Formulas are:

$$S2x = S - \frac{\lambda}{P2 \times NA} \times \tan\frac{\varphi2}{2}$$

$$S2y = \frac{\lambda}{P2 \times NA}$$

$$1 > \sqrt{S2x^2 + S2y^2}$$

$$1 > \sqrt{\left(S - \frac{\lambda}{P2 \times NA} \times \tan\frac{\varphi2}{2}\right)^2 + \left(\frac{\lambda}{P2 \times NA}\right)^2}$$

The lithographic methods described with reference to FIGS. 5-17 can enhance focus margin for printing the support openings 19 without limiting or degrading the fidelity of the pattern for the memory openings 49 in the photoresist layer. By enhancing the focus margin for printing the support openings 19, a three-dimensional memory device can be manufactured with a higher yield.

FIGS. 18A-18H illustrate structural changes in a memory opening 49, which is one of the memory openings 49 in the embodiment structure of FIGS. 4A and 4B. The same structural change occurs simultaneously in each of the other memory openings 49 and in each support opening 19.

Referring to FIG. 18A, a memory opening 49 in the embodiment device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 18B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49C is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 18C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a ferroelectric polarization direction, or any other memory material that can store date by altering electrical resistivity.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49C is formed in the volume of each memory opening 49 that is not filled with the deposited material layers (52, 54, 56, 601).

Referring to FIG. 18D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49C can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49C can be vertically recessed so that the recessed semiconductor surface underneath the memory cavity 49C is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601.

Referring to FIG. 18E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49C in each memory opening, or may fully fill the cavity in each memory opening.

Referring to FIG. 18F, in case the memory cavity 49C in each memory opening is not completely filled by the semiconductor channel layer 60L, a dielectric core layer 62L can be deposited in the memory cavity 49C to fill any remaining portion of the memory cavity 49C within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 18H:
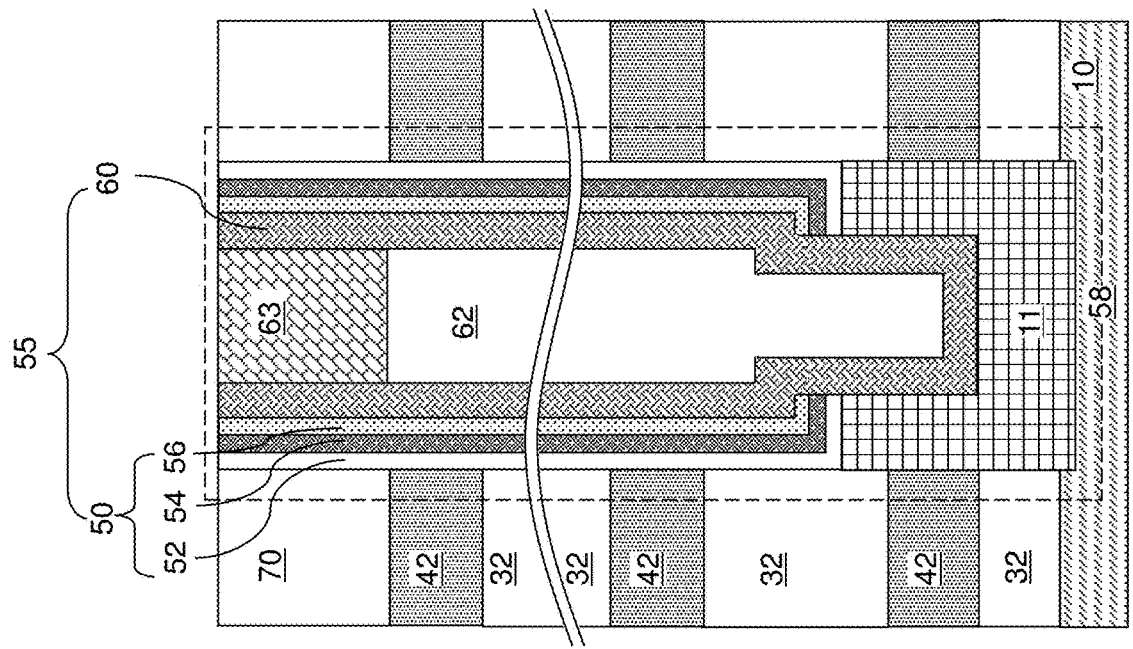
Figure 18G:
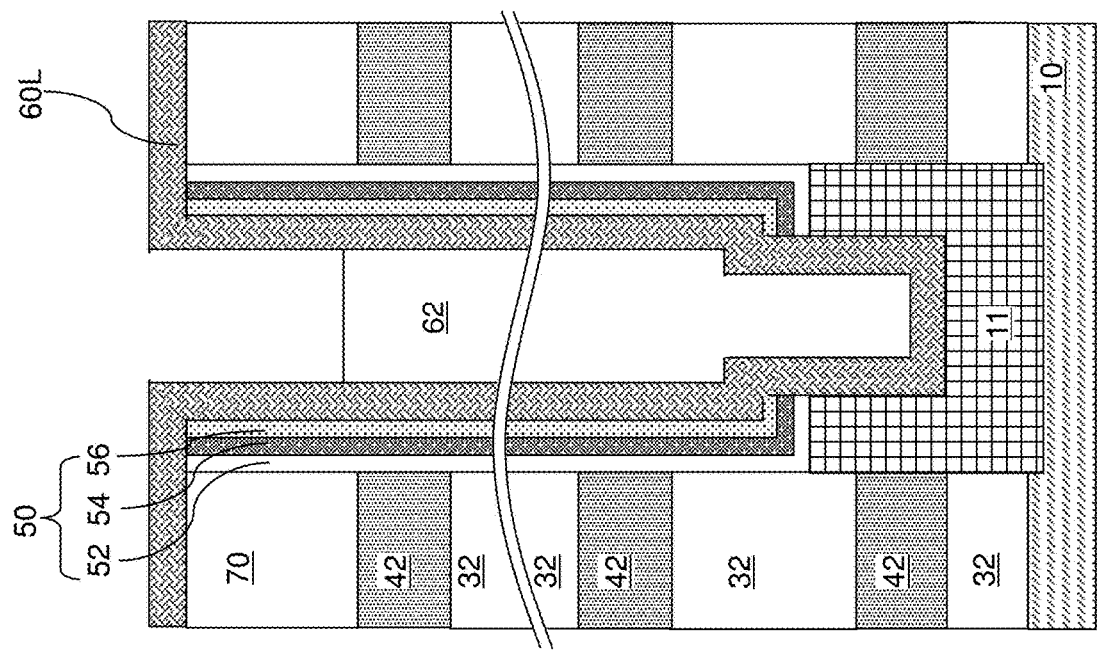

Referring to FIG. 18G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 18H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon. Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. Furthermore, the dielectric material liner 56 may be omitted if a ferroelectric memory material layer 54 is used. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, then the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (e.g., the memory material layer 54) located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening upon subsequent replacement of the sacrificial material layers 42 with electrically conductive layers.

Figure 19:
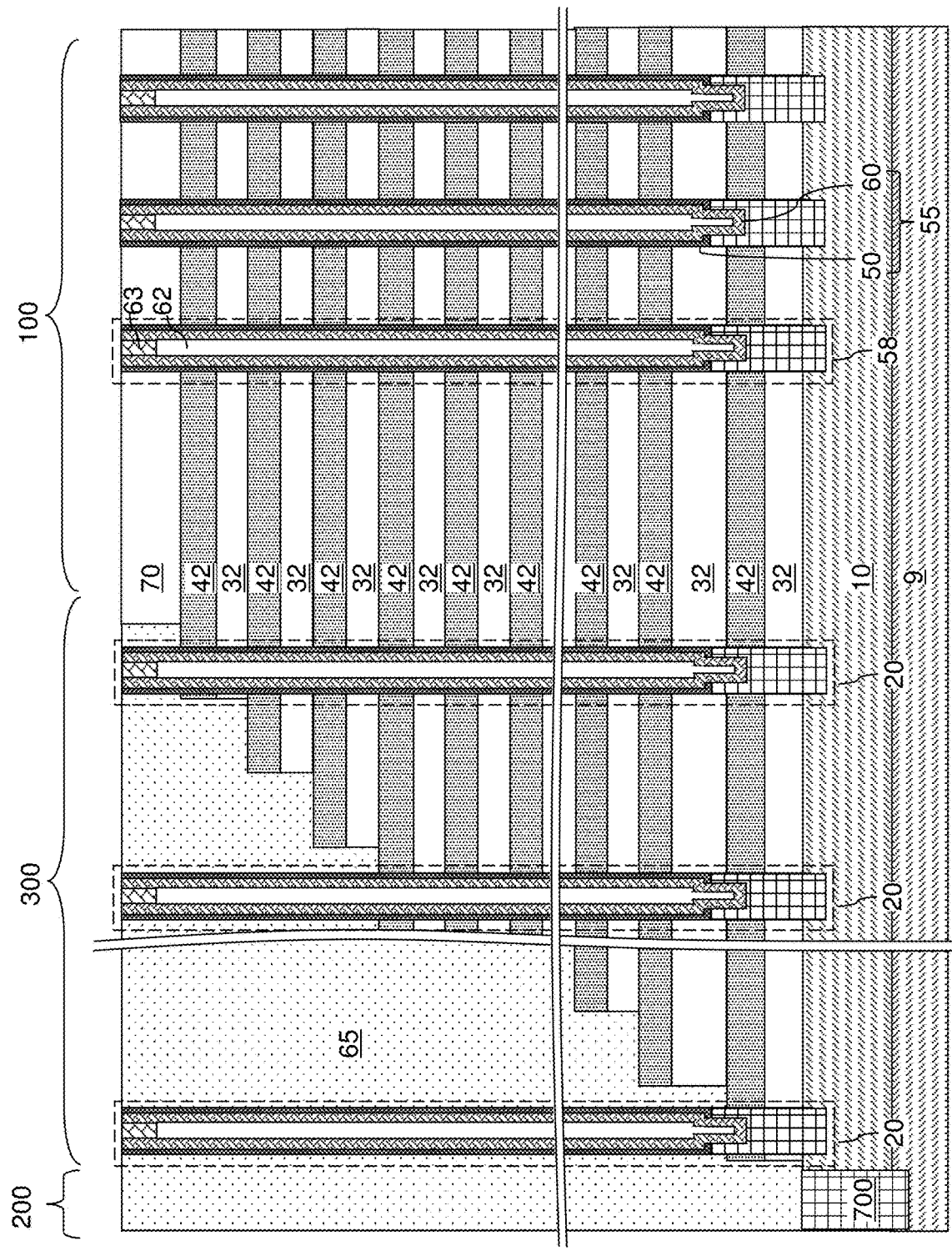
FIG. 19 is a schematic vertical cross-sectional view of the exemplary structure after formation of memory stack structures and support pillar structures according to an embodiment of the present disclosure.

Referring to FIG. 19, the embodiment structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (comprising portions of the memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 20A:
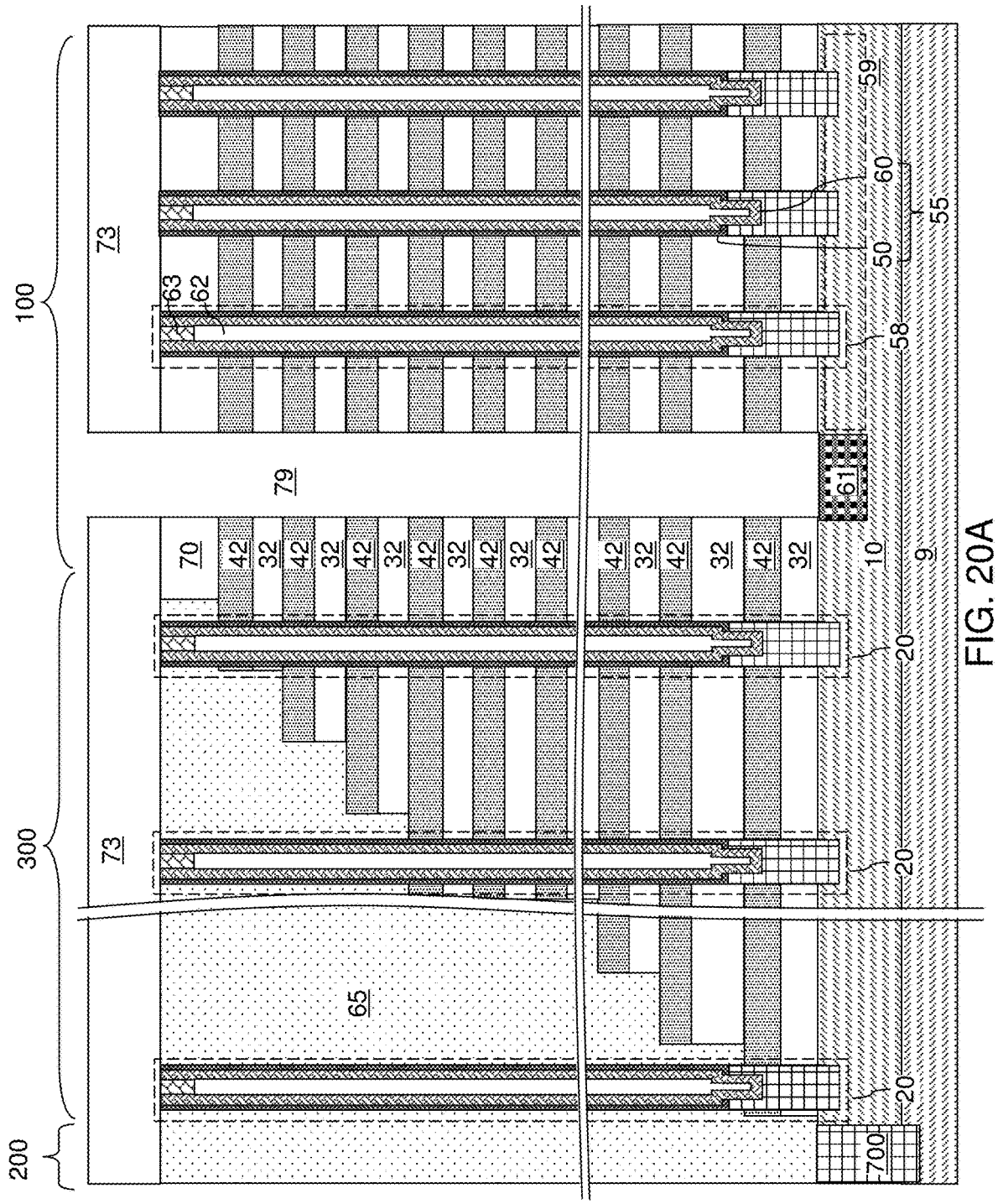
FIG. 20A is a schematic vertical cross-sectional view of the exemplary structure after formation of backside trenches according to an embodiment of the present disclosure.
Figure 20B:
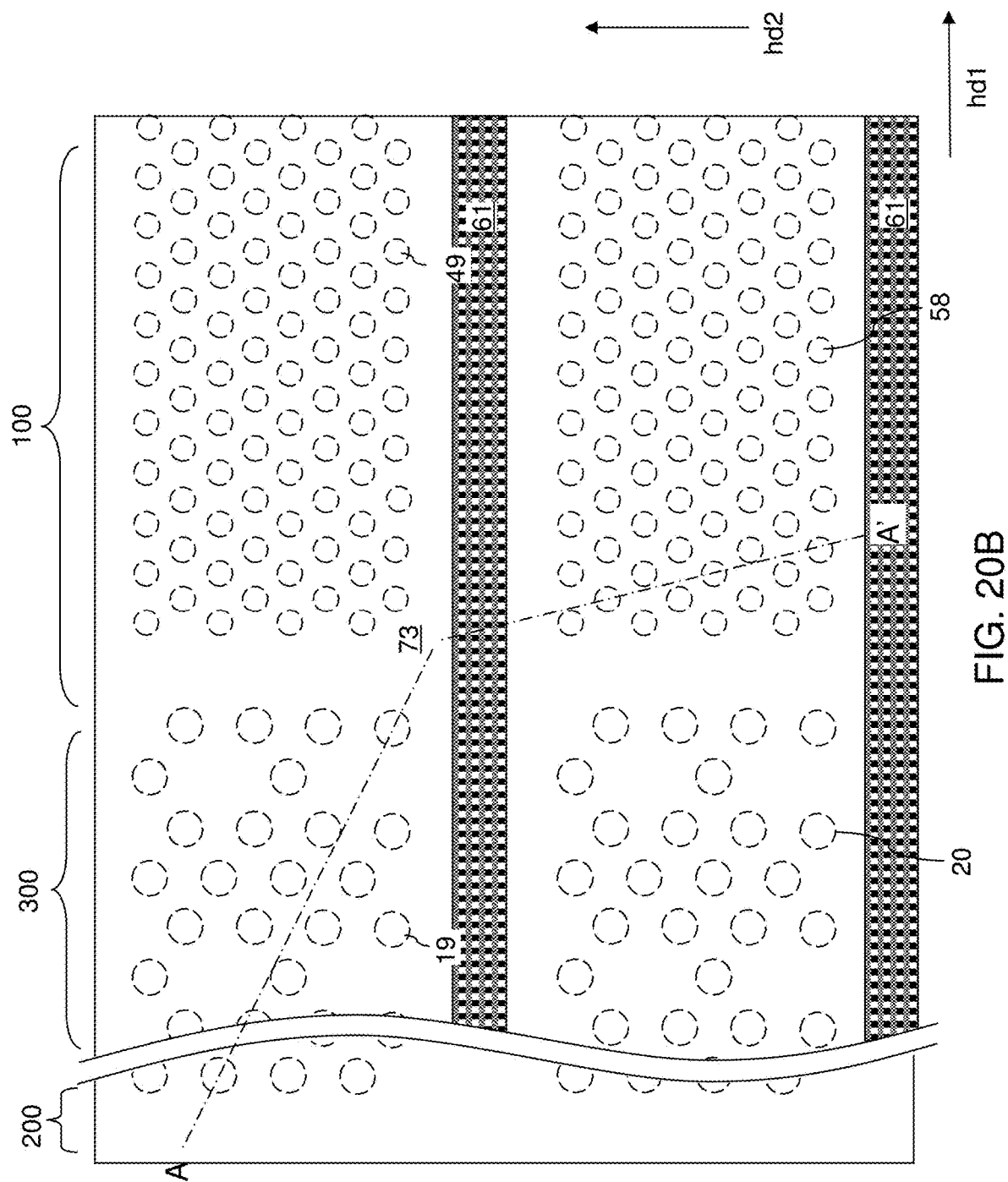
FIG. 20B is a partial see-through top-down view of the exemplary structure of FIG. 20A. The vertical plane A-A' is the plane of the schematic vertical cross-sectional view of FIG. 20A.

Referring to FIGS. 20A and 20B, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 21:
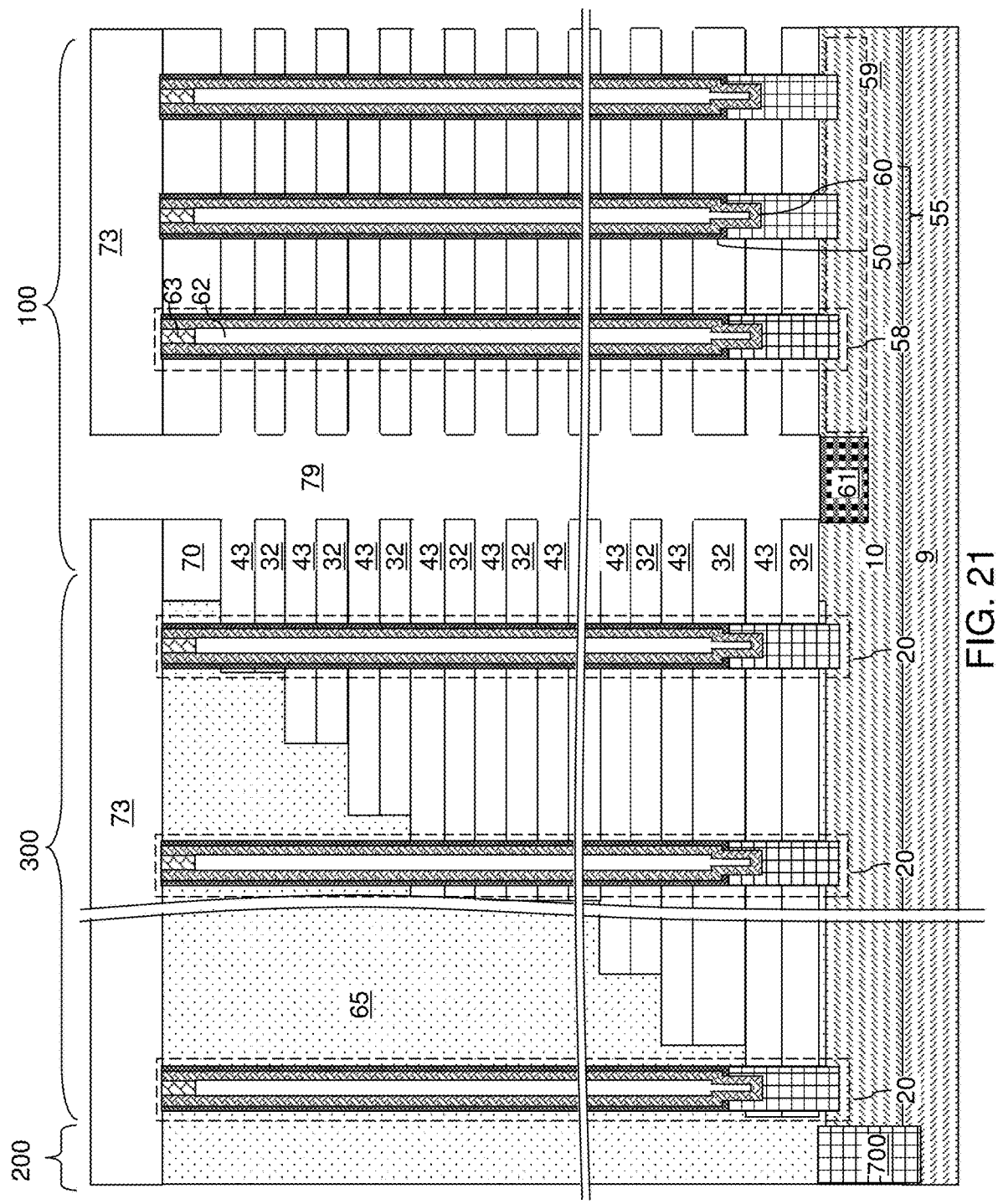
FIG. 21 is a schematic vertical cross-sectional view of the exemplary structure after formation of backside recesses according to an embodiment of the present disclosure.
Figure 22A:
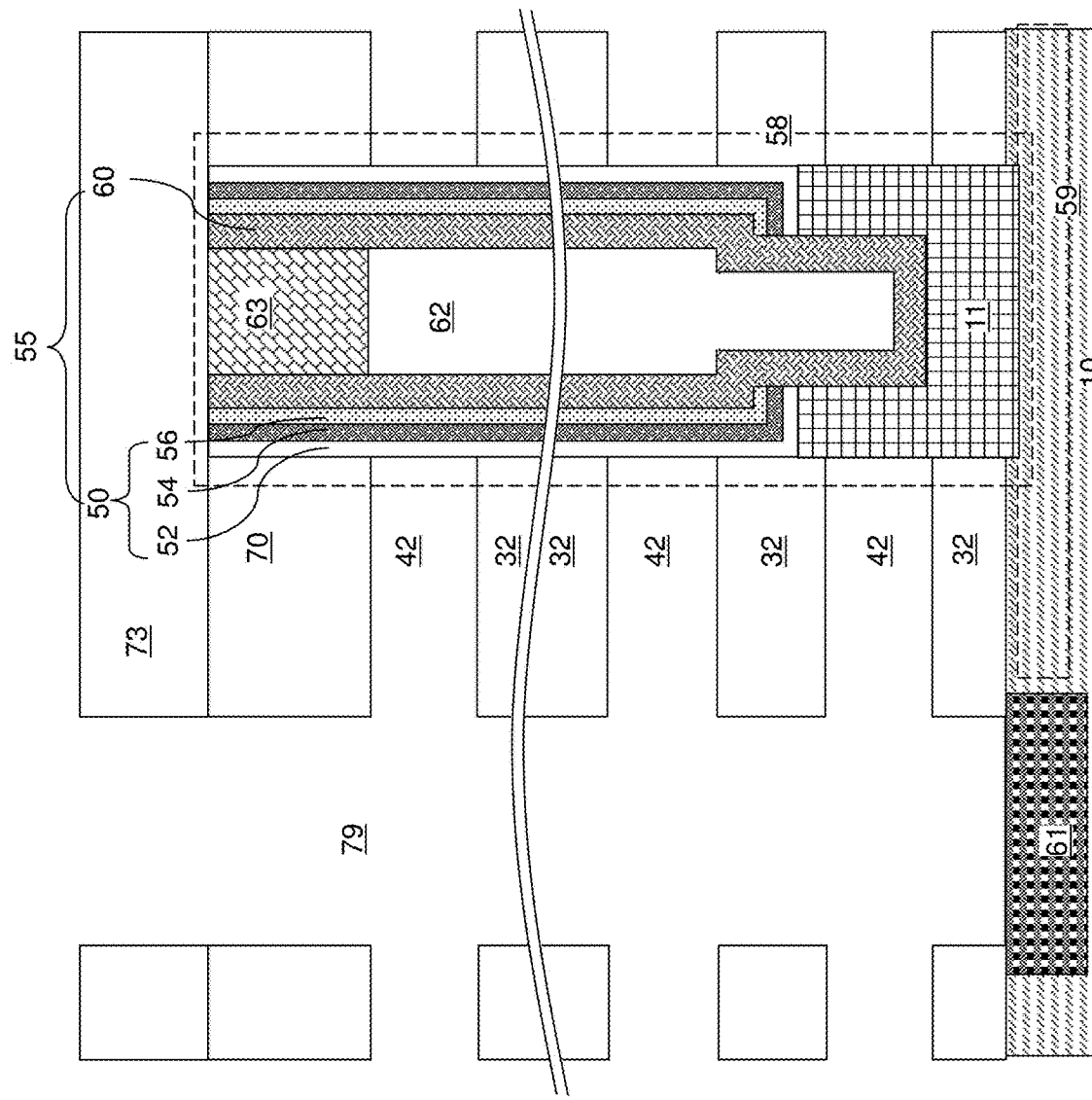
FIGS. 22A-22D are sequential vertical cross-sectional views of a region of the exemplary structure during formation of electrically conductive layers according to an embodiment of the present disclosure.

Referring to FIGS. 21 and 22A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 22B:
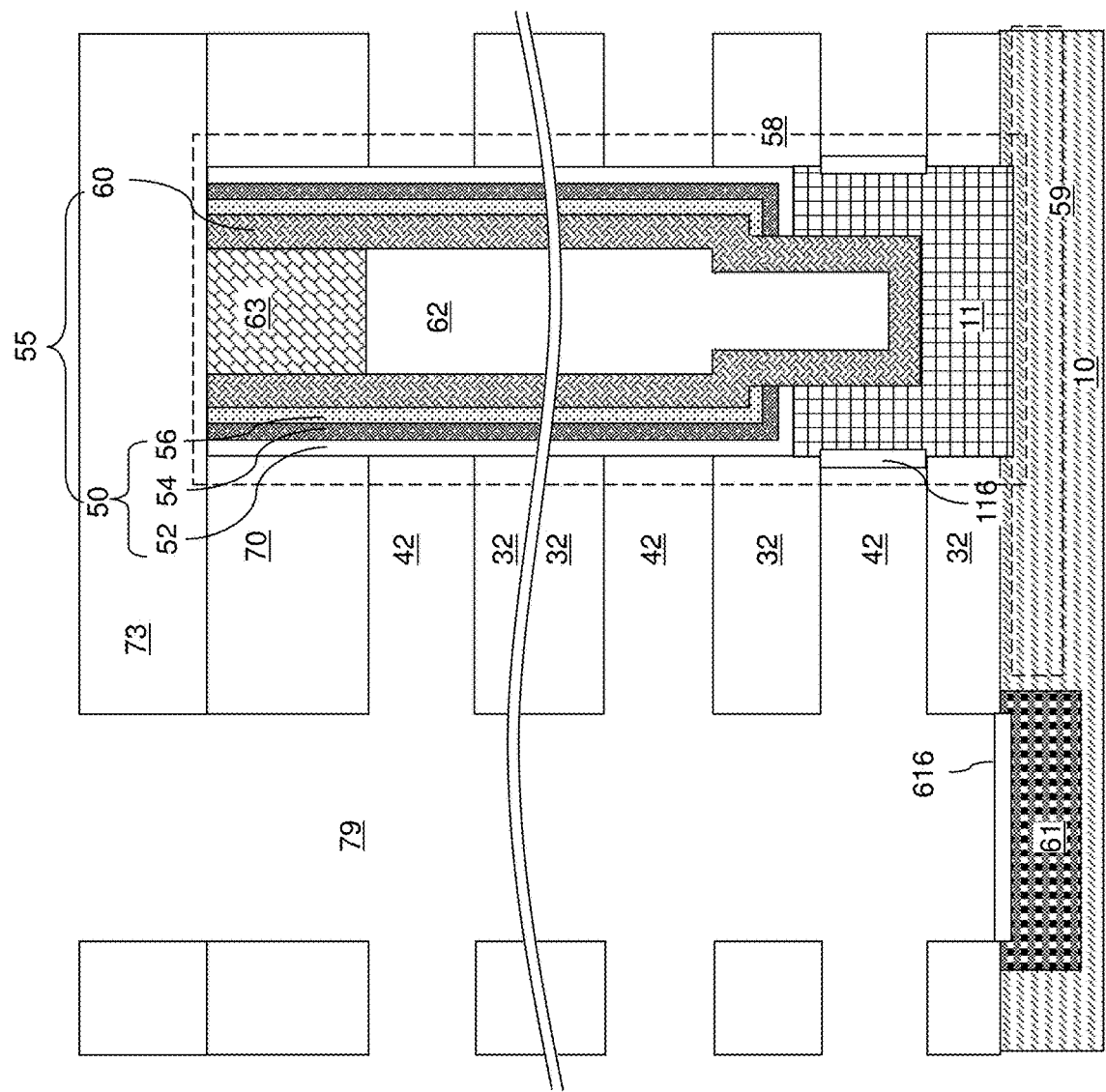

Referring to FIG. 22B, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 22C:
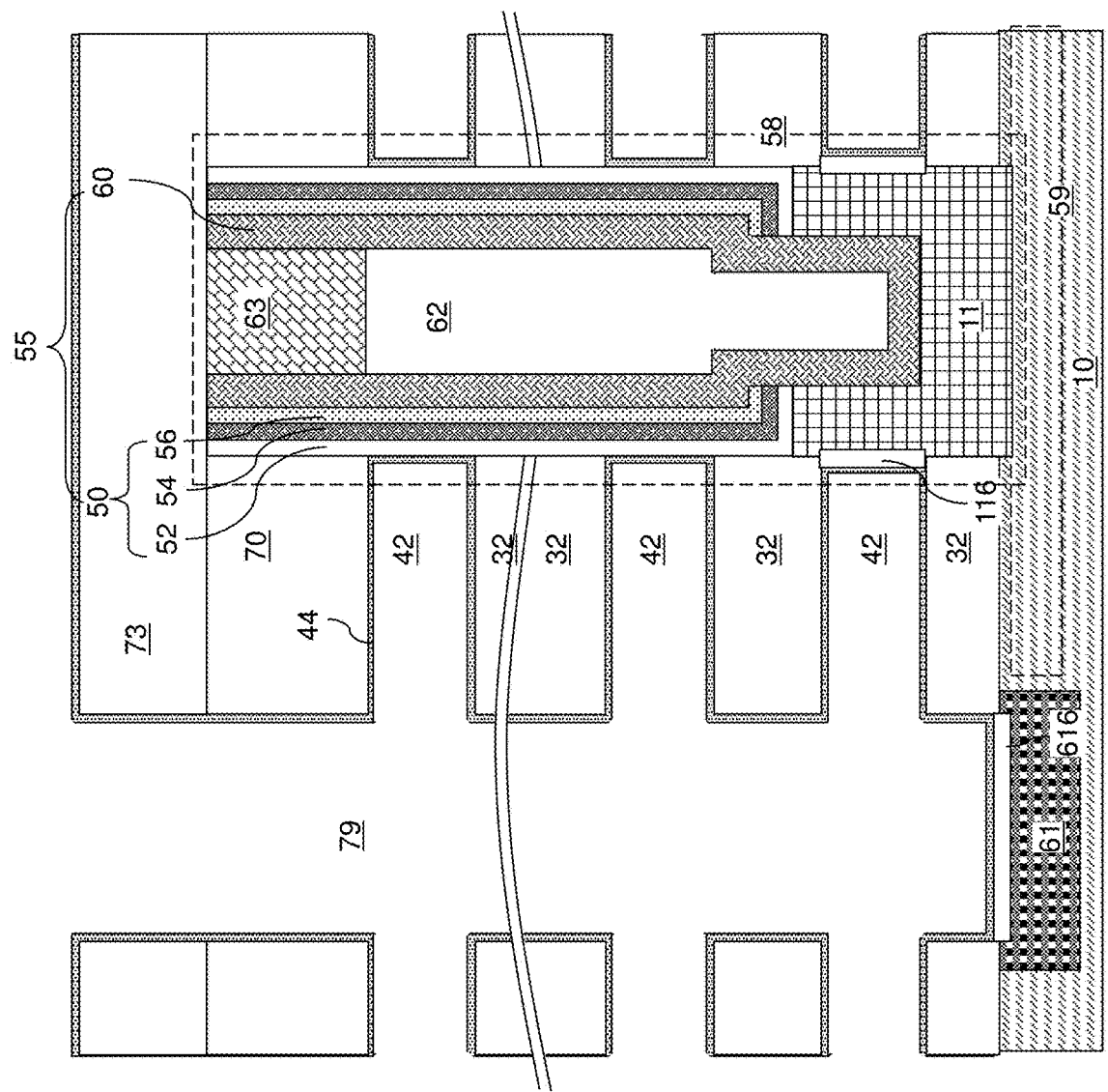

Referring to FIG. 22C, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 22D:
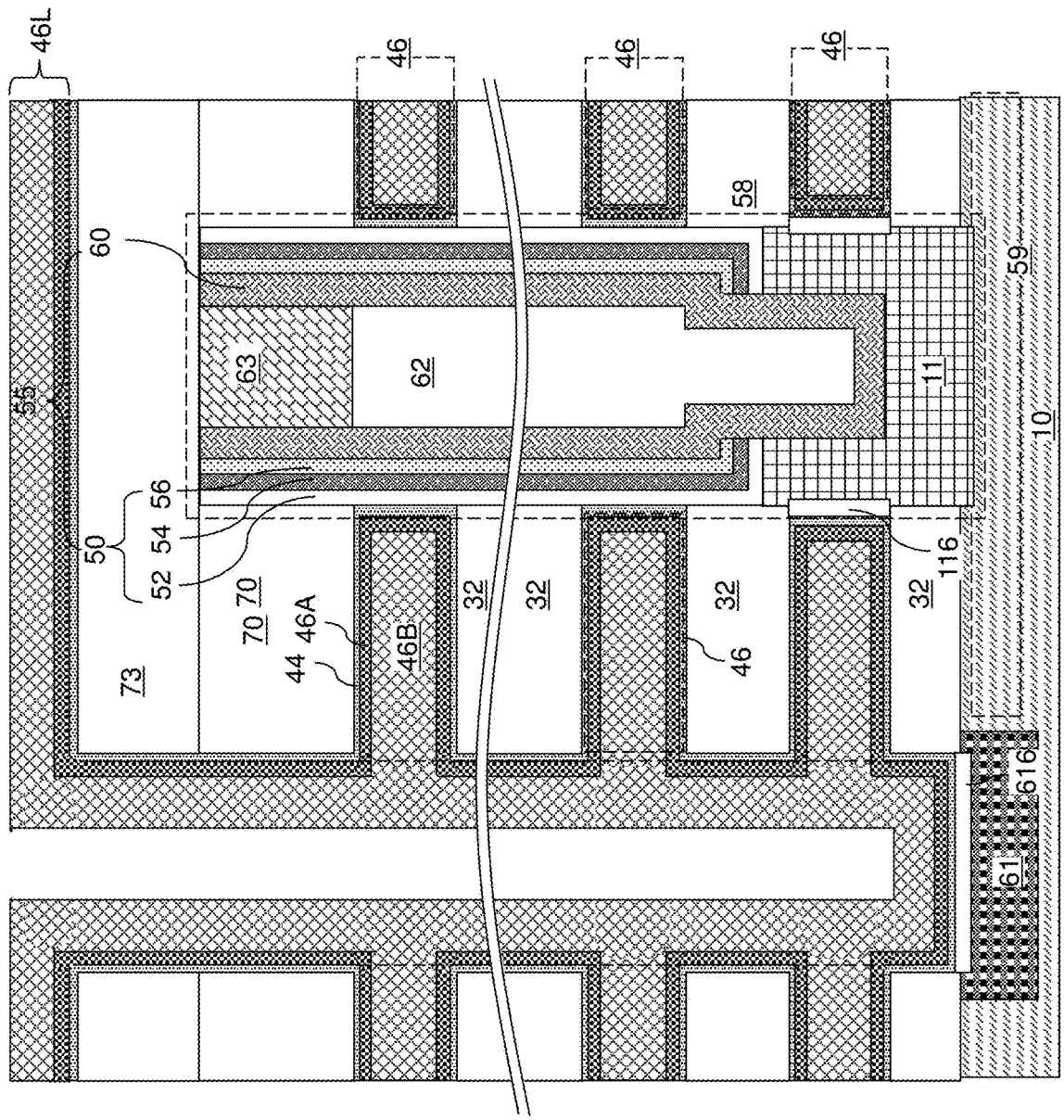

Referring to FIG. 22D, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIG. 22D, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 23A:
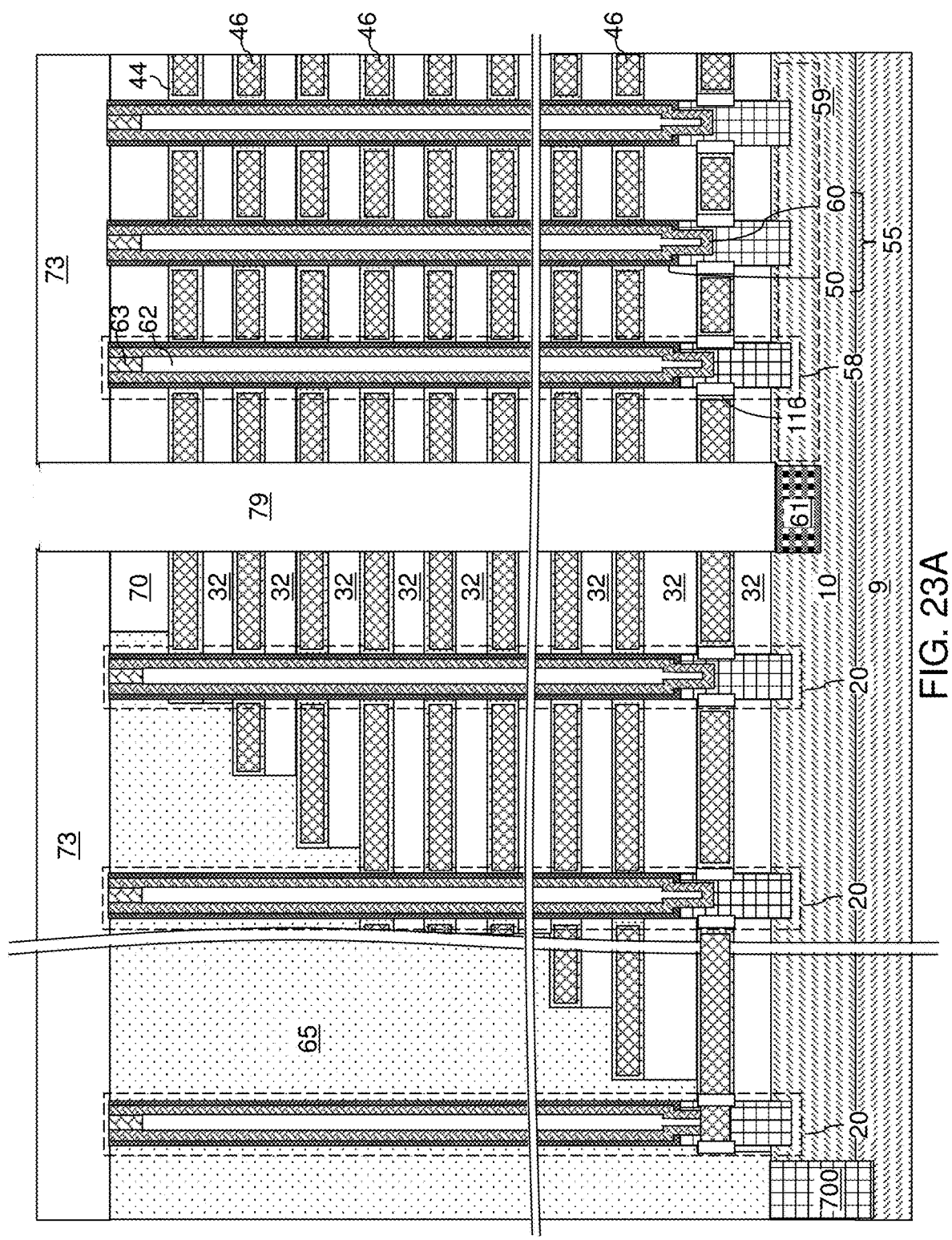
FIG. 23A is a schematic vertical cross-sectional view of the exemplary structure after removal of a deposited conductive material from within the backside trench according to an embodiment of the present disclosure.
Figure 23B:
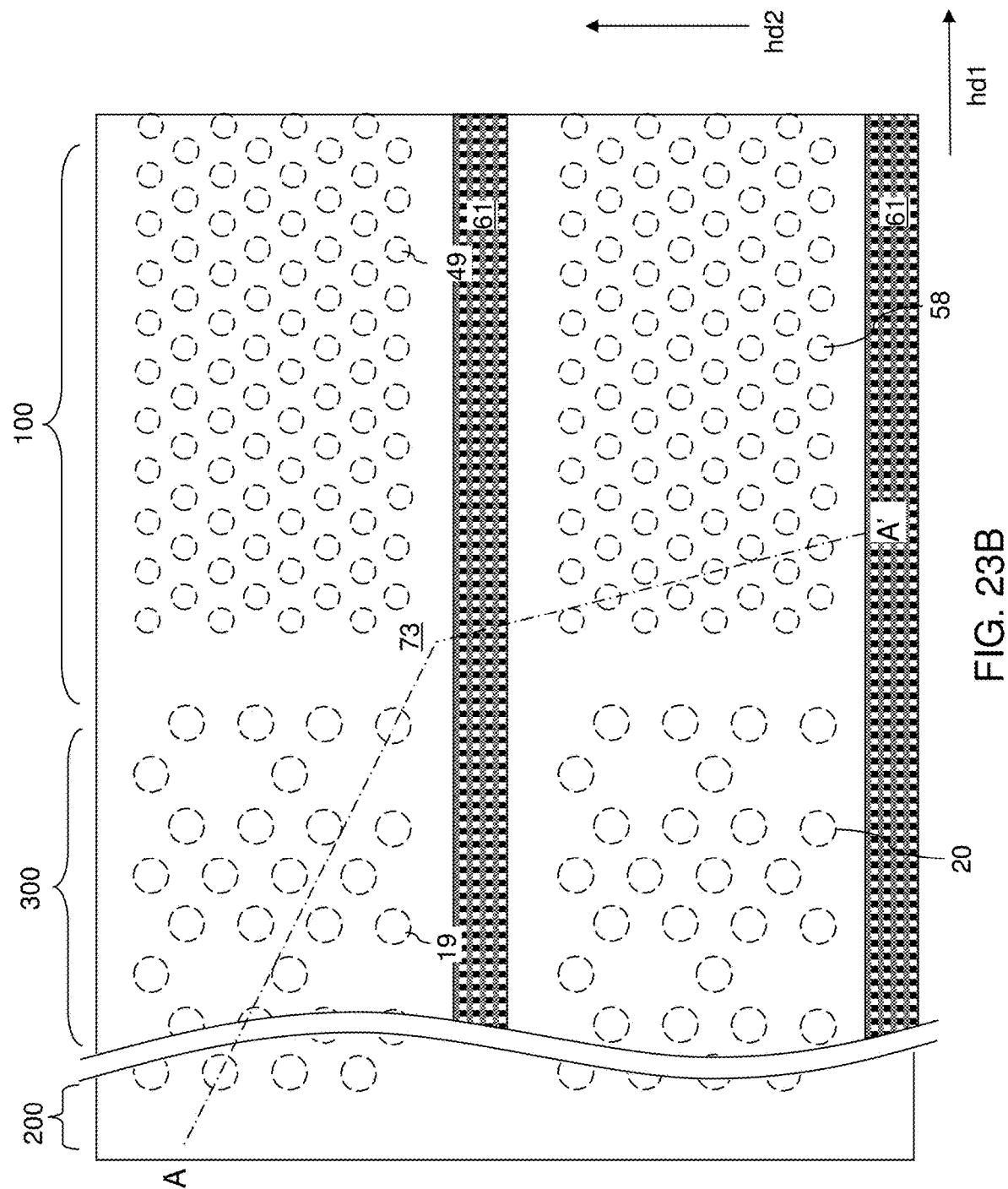
FIG. 23B is a top-down view of the exemplary structure of FIG. 23A. The vertical plane A-A' is the plane of the schematic vertical cross-sectional view of FIG. 23A

Referring to FIGS. 23A and 23B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

At least one bottommost electrically conductive layer 46 provided upon formation of the electrically conductive layers 46 within the alternating stack (32, 46) can comprise a source side select gate electrode for the vertical NAND strings. At least one topmost electrically conductive layer 46 provided upon formation of the electrically conductive layers 46 within the alternating stack (32, 46) can comprise a drain side select gate electrode for the vertical NAND string. Each optional source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Figure 24:
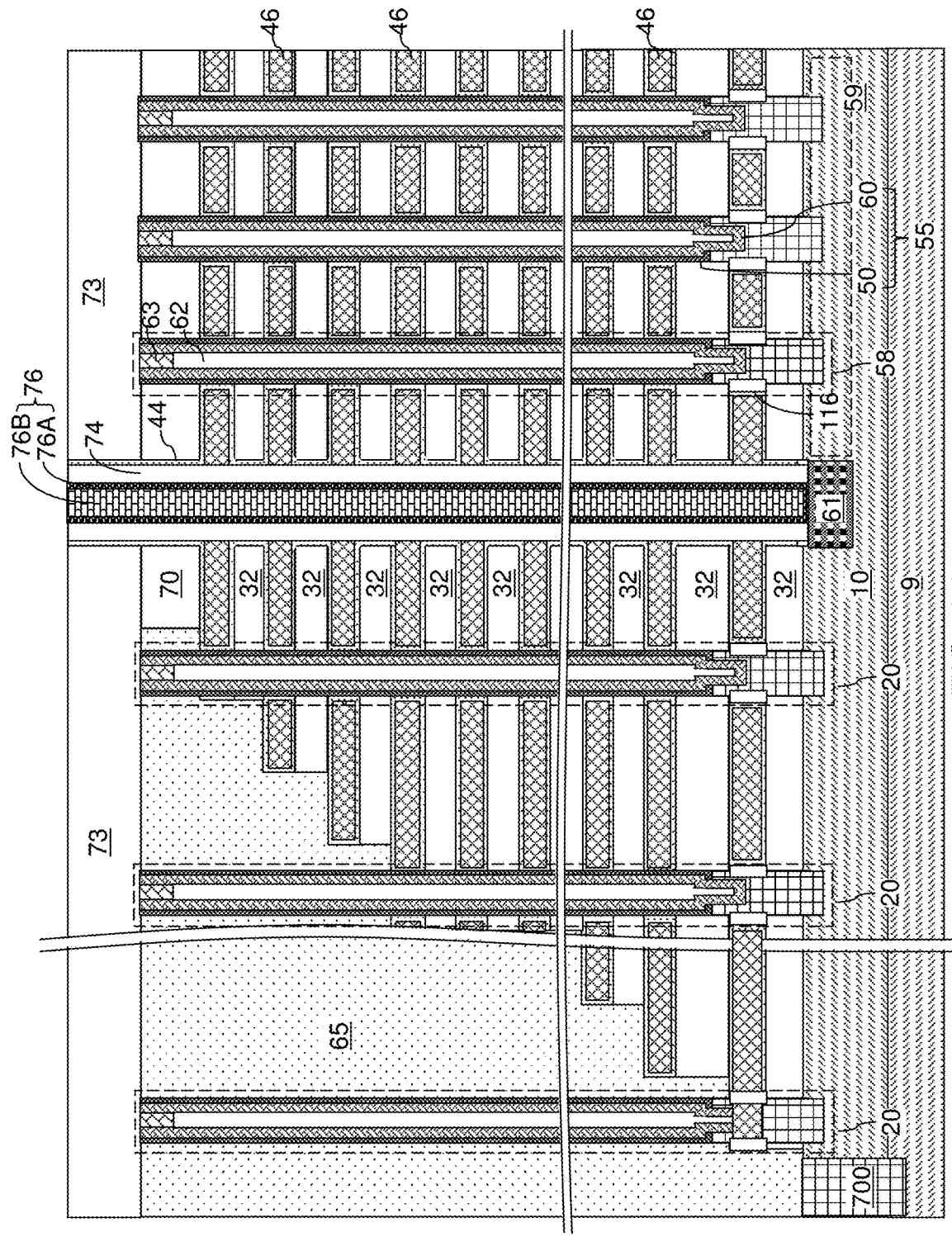
FIG. 24 is a schematic vertical cross-sectional view of the exemplary structure after formation of an insulating spacer and a backside contact structure according to an embodiment of the present disclosure.

Referring to FIG. 24, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 (of the source region 61 if present) can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is included, then the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 25A:
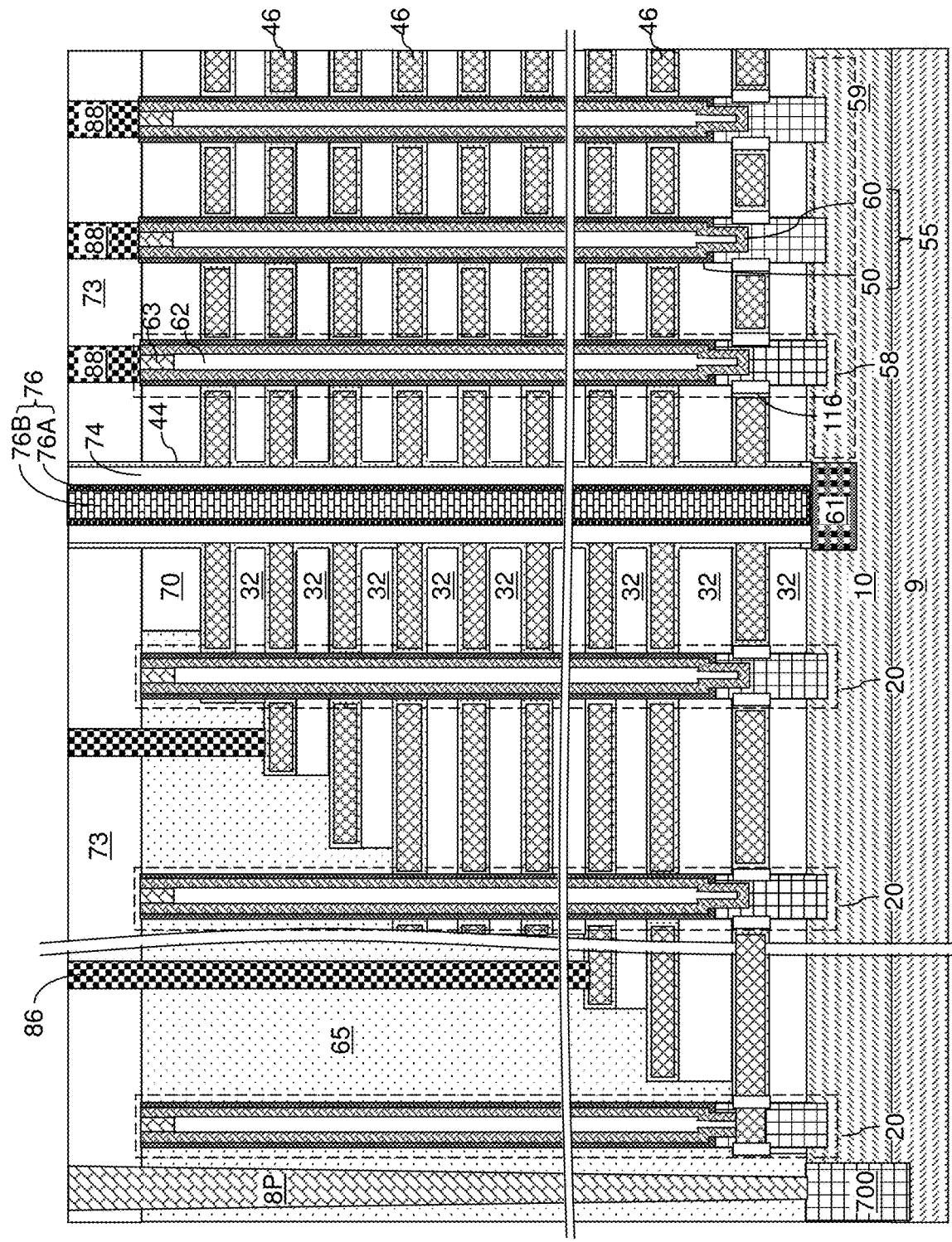
FIG. 25A is a schematic vertical cross-sectional view of the exemplary structure after formation of additional contact via structures according to an embodiment of the present disclosure.
Figure 25B:
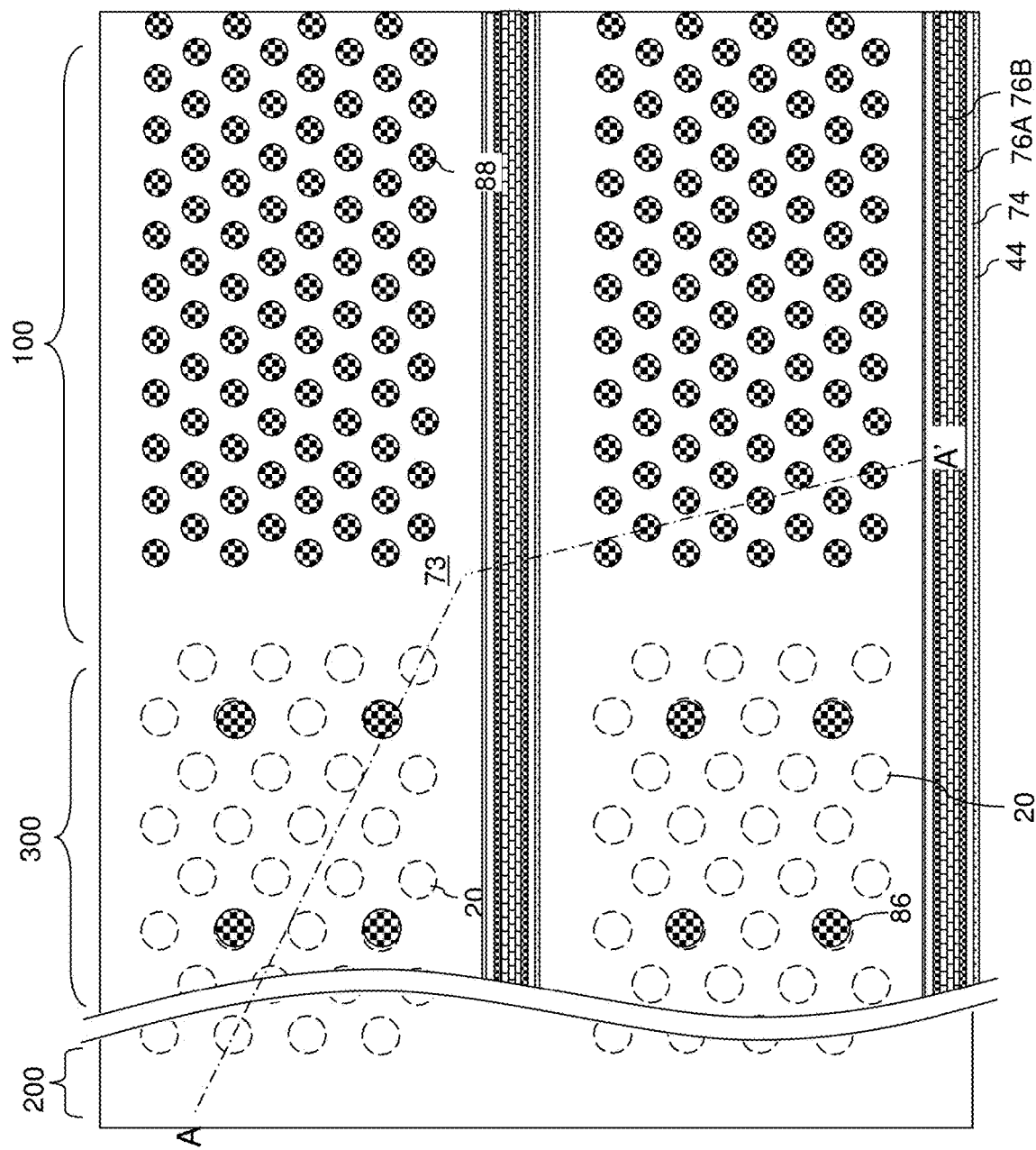
FIG. 25B is a top-down view of the exemplary structure of FIG. 25A. The vertical plane A-A' is the plane of the schematic vertical cross-sectional view of FIG. 25A.

Referring to FIGS. 25A and 25B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. The word line contact via structures 86 do not contact the support pillar structures 20 due to the break in periodicity (i.e., continuity) in the array of the support pillar structures 20 at locations of the word line contact via structures 86.

Referring to all drawings and according to various embodiments of the present disclosure, a three-dimensional memory device is provided, which comprises: an alternating stack of insulating layers 32 and electrically conductive layers 46 located over a substrate (91, 10), wherein the alternating stack (32, 46) comprises a memory array region 100 in which each layer within the alternating stack (32, 46) is present and a staircase region 300 in which lateral extents of the electrically conductive layers 46 decrease as a function of a vertical distance from the substrate (9, 10); memory openings 49 vertically extending through the alternating stack (32, 46) in the memory array region 100 and each having a first lateral dimension (such as a memory opening diameter at a horizontal plane including a top surface of the alternating stack (32, 46)); memory opening fill structures 58 located within a respective one of the memory openings 49, wherein the memory opening fill structures 58 are arranged in a first hexagonal array having a nearest-neighbor direction that is parallel to a first horizontal direction hd1; support openings 19 vertically extending through the alternating stack (32, 46) in the staircase region 300 and each having a second lateral dimension (such as a support opening diameter at the horizontal plane including a top surface of the alternating stack (32, 46)) that is different from the first lateral dimension; and support pillar structures 20 located within a respective one of the support openings 19, wherein the support pillar structures 20 are arranged in a second hexagonal array having a nearest-neighbor direction that is perpendicular to the first horizontal direction hd1.

In one embodiment, the memory openings 49 have horizontal cross-sectional shapes of a first circle having a first diameter at a horizontal plane including a topmost surface of the alternating stack (32, 46); the support openings 19 have horizontal cross-sectional shapes of a second circle having a second diameter at the horizontal plane; and the second diameter is greater than the first diameter. In one embodiment, the ratio of the second diameter to the first diameter is in a range from 1.25 to 1.70.

In one embodiment, each of the memory opening fill structures 58 comprises a respective vertical semiconductor channel 60 and a respective vertical stack of memory elements. In one embodiment, each of the support pillar structures 20 comprises a respective dummy vertical semiconductor channel 60 (which is not electrically connected to a bit line) having a same material composition as the vertical semiconductor channels 60 of the memory opening fill structures 58; and each of the support pillar structures 20 comprises at least one material portion (such as a charge storage layer 54) having a same material composition and a same lateral thickness as the vertical stacks of memory elements of the memory opening fill structures 58.

In one embodiment, each vertical stack of memory elements of the vertical stacks of memory elements comprises portions of a charge storage layer 54 located at levels of the electrically conductive layers 46.

In one embodiment, each of the memory opening fill structures 58 comprises a respective drain region 63 in contact with an upper end of the respective vertical semiconductor channel 60; and a bottom end of each vertical semiconductor channel 60 of the memory opening fill structures 58 is electrically connected to a semiconductor material layer 10 located in or over the substrate (9, 10).

In one embodiment, the three-dimensional memory device comprises a retro-stepped dielectric material portion 65 located above the alternating stack (32, 46) in the staircase region 300 and having stepped surfaces that contact the alternating stack (32, 46), wherein the support openings 19 and the support pillar structures 20 vertically extend through the retro-stepped dielectric material portion 65.

In one embodiment, the three-dimensional memory device comprises contact via structures 86 vertically extending through the retro-stepped dielectric material portion 65 and in contact with a respective one of the electrically conductive layers 46 and having a respective top surface located within a same horizontal plane.

In one embodiment, the three-dimensional memory device comprises: a first backside trench fill structure (74, 76) laterally extending along the first horizontal direction hd1 and contacting a first sidewall of each layer within the alternating stack (32, 46); and a second backside trench fill structure (74, 76) laterally extending along the first horizontal direction hd1 and contacting a second sidewall of each layer within the alternating stack (32, 46), wherein the first hexagonal array and the second hexagonal array are located between the first backside trench fill structure (74, 76) and the second backside trench fill structure (74, 76).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate, wherein the alternating stack comprises a memory array region in which each layer within the alternating stack is present and a staircase region in which lateral extents of the electrically conductive layers decrease as a function of a vertical distance from the substrate;
memory openings vertically extending through the alternating stack in the memory array region and each having a first lateral dimension;
memory opening fill structures located within a respective one of the memory openings, wherein the memory opening fill structures are arranged in a first hexagonal array having a nearest-neighbor direction that is parallel to a first horizontal direction and having a first nearest neighbor pitch a;
support openings vertically extending through the alternating stack in the staircase region and each having a second lateral dimension that is different from the first lateral dimension; and
support pillar structures located within a respective one of the support openings, wherein the support pillar structures are arranged in a second hexagonal array having a nearest-neighbor direction that is perpendicular to the first horizontal direction and having a second nearest neighbor pitch sa, in which s is a scaling factor having a value in a range from 1.25 to 1.7.

2. The three-dimensional memory device of claim 1, wherein:
the memory openings have horizontal cross-sectional shapes of a first circle having a first diameter at a horizontal plane including a topmost surface of the alternating stack;
the support openings have horizontal cross-sectional shapes of a second circle having a second diameter at the horizontal plane; and
the second diameter is greater than the first diameter.

3. The three-dimensional memory device of claim 2, wherein a ratio of the second diameter to the first diameter is in a range from 1.25 to 1.70.

4. The three-dimensional memory device of claim 1, wherein each of the memory opening fill structures comprises a respective vertical semiconductor channel and a respective vertical stack of memory elements.

5. The three-dimensional memory device of claim 4, wherein:
each of the support pillar structures comprises a respective dummy vertical semiconductor channel having a same material composition as the vertical semiconductor channels of the memory opening fill structures; and
each of the support pillar structures comprises at least one material portion having a same material composition and a same lateral thickness as the vertical stacks of memory elements of the memory opening fill structures.

6. The three-dimensional memory device of claim 4, wherein each vertical stack of memory elements of the vertical stacks of memory elements comprises portions of a charge storage layer located at levels of the electrically conductive layers.

7. The three-dimensional memory device of claim 4, wherein:
each of the memory opening fill structures comprises a respective drain region in contact with an upper end of the respective vertical semiconductor channel; and
a bottom end of each vertical semiconductor channel of the memory opening fill structures is electrically connected to a semiconductor material layer located in or over the substrate.

8. The three-dimensional memory device of claim 1, further comprising a retro-stepped dielectric material portion located above the alternating stack in the staircase region and having stepped surfaces that contact the alternating stack, wherein the support openings and the support pillar structures vertically extend through the retro-stepped dielectric material portion.

9. The three-dimensional memory device of claim 8, further comprising contact via structures vertically extending through the retro-stepped dielectric material portion and in contact with a respective one of the electrically conductive layers and having a respective top surface located within a same horizontal plane.

10. The three-dimensional memory device of claim 1, further comprising:
a first backside trench fill structure laterally extending along the first horizontal direction and contacting a first sidewall of each layer within the alternating stack; and
a second backside trench fill structure laterally extending along the first horizontal direction and contacting a second sidewall of each layer within the alternating stack,
wherein the first hexagonal array and the second hexagonal array are located between the first backside trench fill structure and the second backside trench fill structure.

11. The three-dimensional memory device of claim 1, wherein each of the memory opening fill structures comprises a respective vertical semiconductor channel and a respective memory film.

12. The three-dimensional memory device of claim 11, wherein the respective memory film comprises a layer stack including a blocking dielectric layer, a memory material layer, and a dielectric liner.

13. The three-dimensional memory device of claim 12, wherein the memory material layer comprises silicon nitride.

14. The three-dimensional memory device of claim 12, wherein the memory material layer comprises a ferroelectric material.

15. The three-dimensional memory device of claim 12, wherein the dielectric liner comprises a tunneling dielectric layer.

16. The three-dimensional memory device of claim 9, wherein the contact via structures are arranged as rows of contact via structures such that each row of contact via structures laterally extends along a second horizontal direction, and neighboring rows of contact via structures are laterally spaced apart along the first horizontal direction.

17. The three-dimensional memory device of claim 16, wherein the rows of contact via structures are arranged to provide a rectangular array of contact via structures in the staircase region.

18. The three-dimensional memory device of claim 17, wherein a neighboring pair of rows of contact via structures among the rows of contact via structures is laterally spaced apart from each other along the first horizontal direction by at least three rows of support pillar structures each laterally extending along the second horizontal direction.

19. The three-dimensional memory device of claim 9, further comprising a contact-level dielectric layer overlying the alternating stack, wherein each of the contact via structures vertically extends through the contact-level dielectric layer, and wherein the same horizontal plane including the top surfaces of the contact via structures contains a top surface of the contact-level dielectric layer.

20. The three-dimensional memory device of claim 1, wherein the second nearest neighbor pitch is 1.25 to 1.7 times greater than the first nearest neighbor pitch.

* * * * *